United States Patent
Cho et al.

(10) Patent No.: US 9,245,976 B2
(45) Date of Patent: Jan. 26, 2016

(54) VERTICAL CHANNEL TRANSISTOR WITH SELF-ALIGNED GATE ELECTRODE AND METHOD FOR FABRICATING THE SAME

(71) Applicant: SK hynix Inc., Gyeonggi-do (KR)

(72) Inventors: Heung-Jae Cho, Gyeonggi-do (KR);
Eui-Seong Hwang, Gyeonggi-do (KR);
Eun-Shil Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/512,091

(22) Filed: Oct. 10, 2014

(65) Prior Publication Data

US 2015/0031180 A1    Jan. 29, 2015

Related U.S. Application Data

(62) Division of application No. 13/605,550, filed on Sep. 6, 2012, now Pat. No. 8,860,127.

(30) Foreign Application Priority Data

May 31, 2012   (KR) .................. 10-2012-0058607

(51) Int. Cl.
*H01L 29/66* (2006.01)
*H01L 21/28* (2006.01)
*H01L 29/78* (2006.01)
*H01L 29/40* (2006.01)
*H01L 29/423* (2006.01)
*H01L 27/108* (2006.01)

(52) U.S. Cl.
CPC .... *H01L 29/66666* (2013.01); *H01L 21/28026* (2013.01); *H01L 29/402* (2013.01); *H01L 29/407* (2013.01); *H01L 29/42356* (2013.01); *H01L 29/42376* (2013.01); *H01L 29/7827* (2013.01); *H01L 27/10814* (2013.01); *H01L 27/10873* (2013.01)

(58) Field of Classification Search
CPC ............... H01L 29/66666; H01L 29/42356; H01L 29/42376; H01L 29/407; H01L 29/402; H01L 29/7827; H01L 21/28026; H01L 27/10873
See application file for complete search history.

(56) References Cited

U.S. PATENT DOCUMENTS

| | | | |
|---|---|---|---|
| 8,022,457 B2 * | 9/2011 | Seo ...................... | H01L 27/0207 257/296 |
| 2011/0284939 A1 * | 11/2011 | Chung .............. | H01L 27/10805 257/296 |
| 2012/0012927 A1 * | 1/2012 | Uchiyama ......... | H01L 27/10823 257/330 |

* cited by examiner

Primary Examiner — Evan Pert
Assistant Examiner — Damon Hillman
(74) Attorney, Agent, or Firm — IP&T Group LLP

(57) ABSTRACT

A method for fabricating vertical channel transistors includes forming a plurality of pillars which have laterally opposing both sidewalls, over a substrate; forming a gate dielectric layer on both sidewalls of the pillars; forming first gate electrodes which cover any one sidewalls of the pillars and shield gate electrodes which cover the other sidewalls of the pillars and have a height lower than the first gate electrodes, over the gate dielectric layer; and forming second gate electrodes which are connected with upper portions of sidewalls of the first gate electrodes.

28 Claims, 40 Drawing Sheets

VERTICAL CHANNEL TRANSISTOR WITH SELF-ALIGNED GATE ELECTRODE AND METHOD FOR FABRICATING THE SAME

CROSS-REFERENCE TO RELATED APPLICATION

This application is a division of U.S. patent application Ser. No. 13/605,550 filed on Sep. 6, 2012, which claims priority of Korean Patent Application No. 10-2012-0058607, filed on May 31, 2012. The disclosure of each of the foregoing application is incorporated herein by reference in its entirety.

BACKGROUND

1. Field

Exemplary embodiments of the present invention relate to a semiconductor device, and more particularly, to a semiconductor device with a vertical channel transistor and a method for fabricating the same.

2. Description of the Related Art

Most semiconductor devices include transistors. For example, in a memory device such as a DRAM, a memory cell includes a cell transistor such as a MOSFET. In general, in a MOSFET, source/drain regions are formed in a semiconductor substrate, and by this fact, a planar channel is formed between the source region and the drain region. Such a general MOSFET is referred to as a 'planar channel transistor'.

As improvements in the degree of integration and performance are continuously required in a memory device, a MOSFET fabrication technology has a physical limit. For instance, as the size of a memory cell decreases, the size of a MOSFET decreases, and due to this fact, the channel length of the MOSFET cannot help but decrease. If the channel length of a MOSFET decreases, the characteristics of a memory device are likely to deteriorate due to various problems caused in that data retention characteristics deteriorate.

In consideration of these problems, a vertical channel transistor has been suggested. The vertical channel transistor (VCT) has a source region and a drain region which are formed in top and bottom portions of a pillar. The pillar serves as a channel, and a vertical gate electrode is formed on the sidewall of the pillar.

The vertical gate electrode is formed as an all-around gate structure or a double gate structure.

However, as the critical dimension decreases to 20 nm or below due to high integration, since a gap between pillars is narrow, a gate electrode cannot help but be formed thin. If the gate electrode is formed thin, resistance is likely to increase.

Also, since the gap between pillars is narrow, if electrodes are deposited to be thicker than a predetermined thickness, it is difficult to separate electrodes. If an over-etching process is performed to separate the electrodes, an underlying structure is likely to be etched and attacked in a region with a wide gap (for example, a pad region).

SUMMARY

Embodiments of the present invention are directed to a semiconductor device which has a vertical channel transistor capable of reducing the resistance of a vertical gate electrode, and a method for fabricating the same.

In accordance with an embodiment of the present invention, a method for fabricating vertical channel transistors may include: forming a plurality of pillars which have laterally opposing both sidewalls, over a substrate; forming a gate dielectric layer on both sidewalls of the pillars; forming first gate electrodes which cover any one sidewalls of the pillars and shield gate electrodes which cover the other sidewalls of the pillars and have a height lower than the first gate electrodes, over the gate dielectric layer; and forming second gate electrodes which are connected with upper portions of sidewalls of the first gate electrodes.

In accordance with another embodiment of the present invention, a method for fabricating vertical channel transistors may include: forming a plurality of pillars which have laterally opposing both sidewalls, over a substrate; forming a gate dielectric layer on both sidewalls of the pillars; forming first gate electrodes which cover any one sidewalls of both sidewalls of the pillars; and forming second gate electrodes which are connected with upper portions of sidewalls of the first gate electrodes.

In accordance with yet another embodiment of the present invention, a method for fabricating a semiconductor device may include: forming hard mask layer patterns over a semiconductor substrate; forming bodies by etching the semiconductor substrate using the hard mask layer patterns as an etch barrier; forming buried bit lines in the bodies; etching the hard mask layer patterns and upper portions of the bodies to form pillars which have laterally opposing both sidewalls; forming first gate electrodes on any one sidewalls of both sidewalls of the pillars; forming second gate electrodes which are connected with upper portions of sidewalls of the first gate electrodes; and forming storage nodes which are connected with the pillars.

In accordance with still another embodiment of the present invention, vertical channel transistors may include: a plurality of pillars vertically formed over a substrate and having laterally opposing both sidewalls; a gate dielectric layer formed on both sidewalls of the pillars; first gate electrodes formed on any one sidewalls of the pillars over the gate dielectric layer; and second gate electrodes, wherein each of the second gate electrode is connected with an upper portion of a corresponding first gate electrode.

In accordance with yet still another embodiment of the present invention, a semiconductor device may include: vertical channel transistors including a plurality of pillars which are formed on a substrate and have laterally opposing both sidewalls, a gate dielectric layer which is formed on both sidewalls of the pillars, and vertical gate electrodes which are formed on any one sidewalls of the pillars over the gate dielectric layer; capacitors including storage nodes which are connected with top portions of the pillars; and buried bit lines connected with bottom portions of the pillars.

DETAILED DESCRIPTION

Figure 1A:
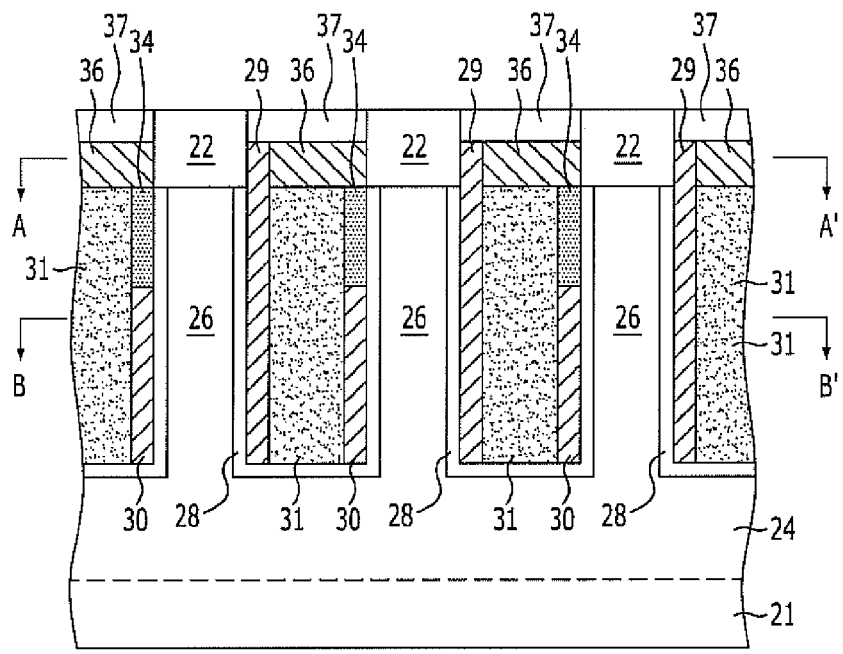
FIG. 1A is a view illustrating vertical channel transistors in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
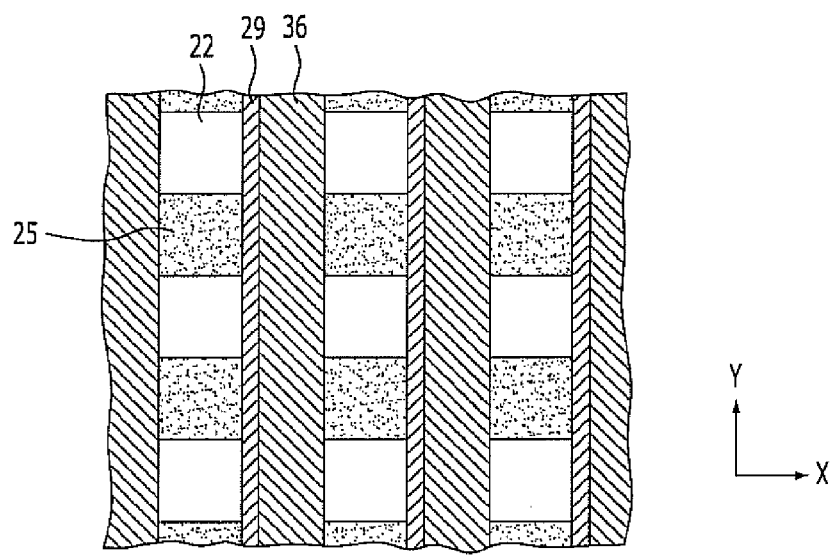
FIG. 1B is a plan view taken along the line A-A' of FIG. 1A.

FIG. 1A is a view illustrating vertical channel transistors in accordance with a first embodiment of the present invention. FIG. 1B is a plan view taken along the line A-A' of FIG. 1A, and FIG. 1C is a plan view taken along the line B-B' of FIG. 1A.

Figure 1C:
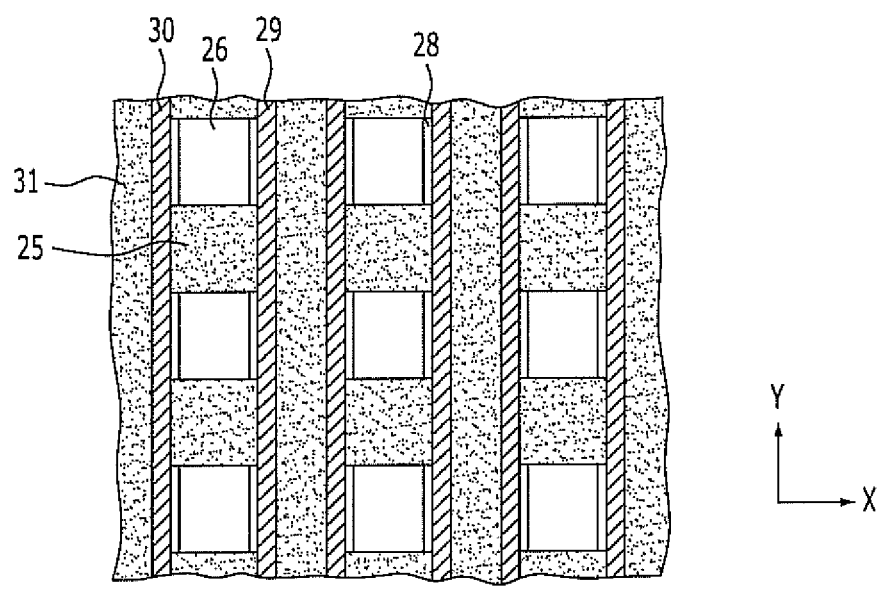
FIG. 1C is a plan view taken along the line B-B' of FIG. 1A.

Referring to FIGS. 1A to 1C, vertical channel transistors in accordance with a first embodiment of the present invention may include pillars 26, first gate electrodes 29, shield gate electrodes 30, and second gate electrodes 36.

First, a plurality of pillars 26 are formed on a semiconductor substrate 21 to vertically project from the surface of the semiconductor substrate 21. Bodies 24 may be further formed under the pillars 26. The pillars 26 may vertically project from the surfaces of the bodies 24. Hard mask layer patterns 22 may be formed on the pillars 26. The plurality of pillars 26 may have a matrix arrangement. The pillars 26 may be quadrangular pillars each of which has a plurality of sidewalls. The pillars 26 may be arranged to be isolated by a dielectric layer 25 in a first direction Y, and the first and second sidewalls of the pillars 26 laterally opposing each other may be exposed in a second direction X. Each pillar 26 may have a source region, a drain region and a channel region (not numbered). The drain region may be formed in top portion of the pillar 26, and the source region may be formed in bottom portion of the pillar 26. The channel region may be formed between the drain region and the source region. The semiconductor substrate 21, the bodies 24 and the pillars 26 include a silicon-containing substance. For example, a silicon substrate or a silicon-germanium substrate may be used. Accordingly, the pillar 26 may include a semiconductor pillar, a silicon pillar or a silicon-germanium pillar.

A gate dielectric layer 28 is formed on the first sidewalls and the second sidewalls of the pillars 26. The gate dielectric layer 28 may include a silicon oxide or a high-k substance.

The first gate electrodes 29 are formed on the gate dielectric layer 28 to cover the first sidewalls of the pillars 26. The shield gate electrodes 30 are formed on the gate dielectric layer 28 to cover the second sidewalls of the pillars 26. The shield gate electrodes 30 are formed to have a height lower than the first gate electrodes 29. The first gate electrodes 29 may be vertical gate electrodes.

The second gate electrodes 36 which are connected to the upper portions of the sidewalls of the first gate electrodes 29 are formed between the plurality of pillars 26. The second gate electrodes 36 may serve as word lines. The second gate electrodes 36 may have shapes which are buried in the upper portions of the spaces defined between the plurality of pillars 26. For example, the second gate electrodes 36 may be buried between the hard mask layer patterns 22. A first dielectric layer 31 may be formed between the first gate electrodes 29 and the shield gate electrodes 30, and a second dielectric layer 34 may be formed on the shield gate electrodes 30. The first dielectric layer 31 and the second dielectric layer 34 may be recessed by a predetermined depth, and the second gate electrodes 36 may be formed on the first dielectric layer 31 and the second dielectric layer 34 which are recessed. The shield gate electrodes 30 neighboring the second gate electrodes 36 are isolated by the second dielectric layer 34.

The first gate electrodes 29 and the shield gate electrodes 30 have line-shaped vertical gate structures which extend in the first direction Y. The second gate electrodes 36 have shapes which extend in the first direction Y in the same manner as the first gate electrodes 29. The first gate electrodes 29 and the shield gate electrodes 30 may include a metal nitride or a low resistance metal. For example, the first gate electrodes 29 and the shield gate electrodes 30 may include TiN, TiAlN, WN, TaN, W, Al, Ru, Pt, Au, or the like. The second gate electrodes 36 may include W, Al, Ru, Pt, Au, or the like. The first gate electrodes 29 and the second gate electrodes 36 may be recessed by a predetermined depth, and a capping layer 37 may be additionally formed on the first gate electrodes 29 and the second gate electrodes 36 which are recessed.

According to FIGS. 1A to 1C, the vertical channel transistors in accordance with the first embodiment of the present invention have double gate structures in which the shield gate electrodes 30 and the first gate electrodes 29 are formed on both sidewalk of the pillars 26. The first gate electrodes 29 become the gate electrodes of vertical channel transistors. Furthermore, as only the first gate electrodes 29 are formed on the sidewalls of the pillars 26, the first gate electrodes 29 may be formed to have a substantial thickness. According to this fact, gate resistance may be reduced. The shield gate electrodes 30 function to shield electric fields by neighbor gates, that is, the neighbor first gate electrodes 29, by which a neighbor gate effect may be minimized.

Figure 2:
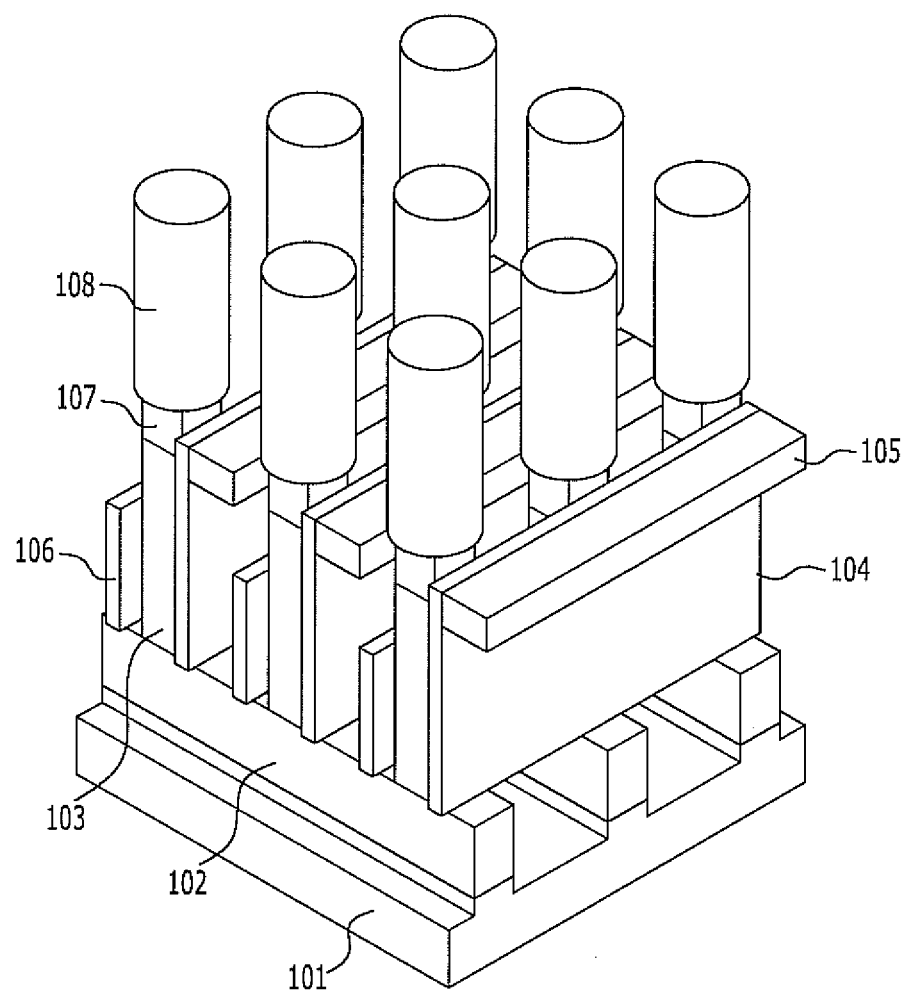
FIG. 2 is a perspective view illustrating a semiconductor device to which the vertical channel transistors in accordance with the first embodiment of the present invention are applied.

FIG. 2 is a perspective view illustrating a semiconductor device to which the vertical channel transistors in accordance with the first embodiment of the present invention are applied.

Referring to FIG. 2, vertical channel transistors include first gate electrodes 104, second gate electrodes 105, and pillars 103. Shield gate electrodes 106 are formed on the sidewalls of the pillars 103. As buried bit lines 102 and capacitors 108 are connected to the vertical channel transistors, a semiconductor device such as a DRAM may be realized. The buried bit lines 102 may be electrically connected with the bottom portions of the pillars 103. The buried bit lines 102 may be vertically formed on a semiconductor substrate 101 and may extend in a first direction. The first gate electrodes 104 and the second gate electrodes 105 may extend in a second direction perpendicularly crossing with the first direction. The capacitors 108 may be electrically connected with the top portions of the pillars 103. Contact plugs 107 may be additionally formed between the capacitors 108 and the pillars 103. While not shown, the capacitors 108 may include storage nodes, a dielectric layer and plate nodes. The vertical channel transistors may be applied not only to a memory such as a DRAM but also to a nonvolatile memory such as a flash memory.

FIGS. 3A to 3I are plan views explaining an exemplary method for fabricating the vertical channel transistors in accordance with the first embodiment of the present invention. FIGS. 4A to 4I are cross-sectional views taken along the line C-C' of FIGS. 3A to 3I.

Figure 3A:
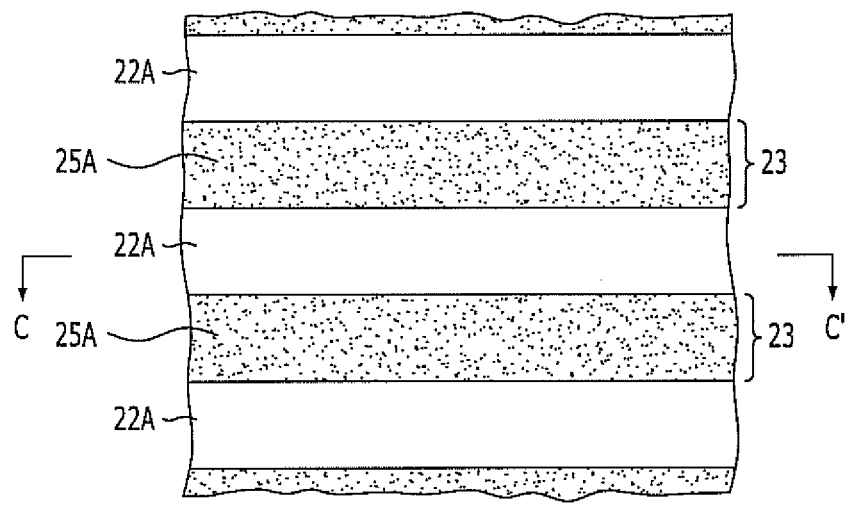
FIGS. 3A to 3I are plan views explaining an exemplary method for fabricating the vertical channel transistors in accordance with the first embodiment of the present invention.
Figure 4A:
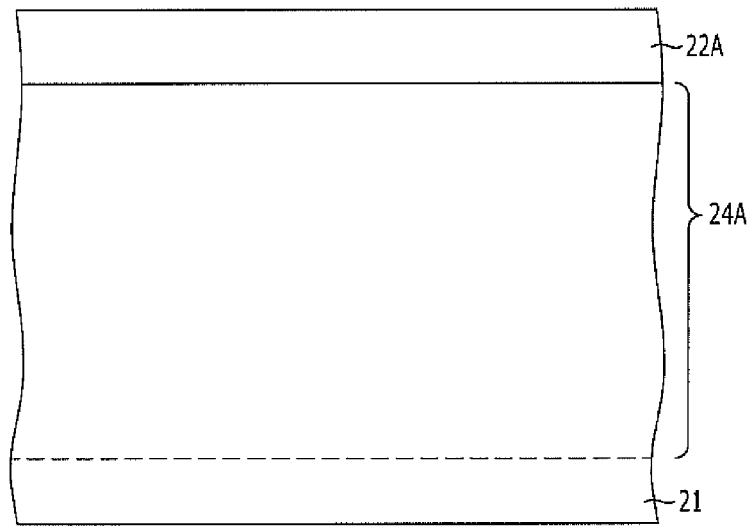
FIGS. 4A to 4I are cross-sectional views taken along the line C-C' of FIGS. 3A to 3I.

Referring to FIGS. 3A and 4A, hard mask layer patterns 22A are formed on a semiconductor substrate 21. The semiconductor substrate 21 includes a silicon-containing substance. For example, the semiconductor substrate 21 includes a silicon substrate or a silicon-germanium substrate. The hard mask layer patterns 22A include a nitride such as a silicon nitride. Also, the hard mask layer patterns 22A may include a silicon oxide or amorphous carbon. The hard mask layer patterns 22A may have a multi-layered structure including an oxide or a nitride. For example, the hard mask layer patterns 22A may be stacked in order of a hard mask (HM) nitride and a hard mask oxide. Also, the hard mask layer patterns 22A may be stacked in order of a hard mask nitride, a hard mask oxide, a hard mask silicon oxynitride and hard mask carbon. In the case where a hard mask nitride is included, a pad oxide may be additionally formed between the semiconductor substrate 21 and the hard mask layer patterns 22A. The pad oxide may include a silicon oxide. The hard mask layer patterns 22A may be formed by being patterned using photoresist patterns after forming a hard mask layer. The hard mask layer patterns 22A may be formed to extend in a second direction.

By etching the semiconductor substrate 21 by a predetermined depth using the hard mask layer patterns 22A as an etch mask, a plurality of bodies 24A are formed. The bodies 24A are separated from one another by first trenches 23. The plurality of bodies 24A are separated from one another by the first trenches 23. The bodies 24A are formed to vertically extend from the surface of the semiconductor substrate 21. The bodies 24A have laterally opposing sidewalls. When viewed from the top, the bodies 24A have linear shapes which are separated from one another by the first trenches 23. For example, the bodies 24A have linear structures which extend in the second direction.

By forming the bodies 24A as described above, a plurality of structures including the bodies 24A and the hard mask layer patterns 22A are formed on the semiconductor substrate 21. The plurality of structures are separated from one another by the first trenches 23. While not shown, after defining the first trenches 23, buried bit lines (BBL) may be additionally formed in the bodies 24A using a substance such as a metal nitride. This will be described later.

Next, an interlayer dielectric layer 25A is formed to fill the spaces between the bodies 24A. The interlayer dielectric layer 25A may include an oxide layer such as a silicon oxide. The interlayer dielectric layer 25A may be planarized through CMP (chemical mechanical polishing) or the like until the surfaces of the hard mask layer patterns 22A are exposed.

Figure 3B:
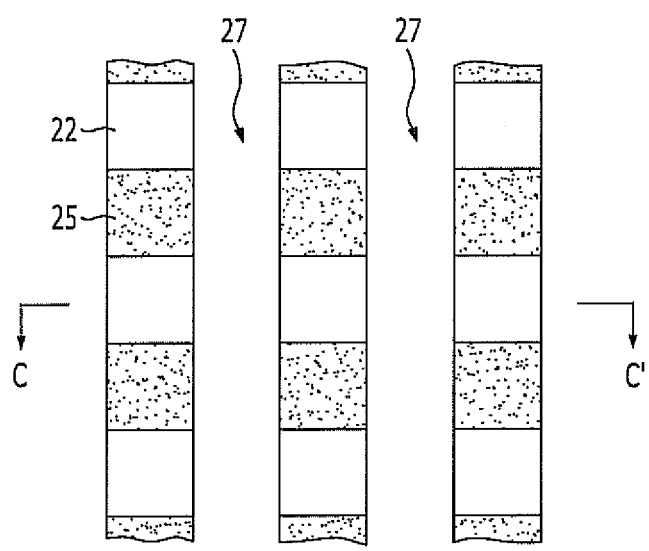
Figure 4B:
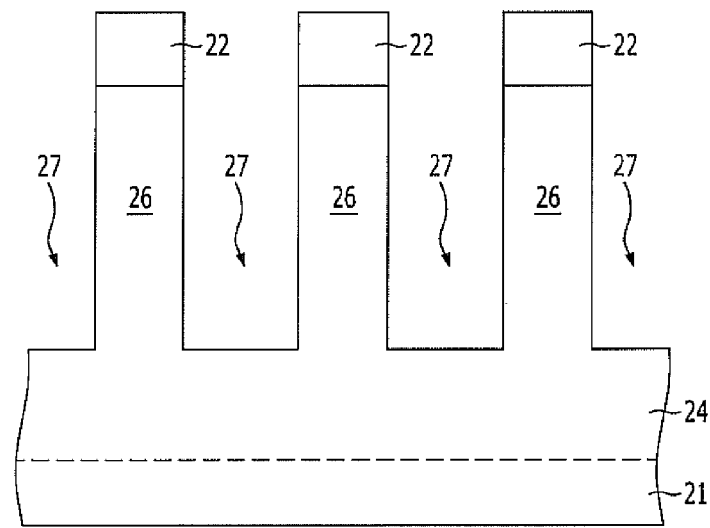

Referring to FIGS. 3B and 4B, photoresist patterns (not shown) are formed to extend in a direction crossing with the bodies 24A, that is, a first direction. The hard mask layer patterns 22A and the bodies 24A are etched using the photoresist patterns as an etch barrier. According to this fact, a plurality of pillars 26 are formed. When etching the bodies 24A, the interlayer dielectric layer 25A and the hard mask layer patterns 22A may also be etched. Accordingly, the hard mask layer patterns 22A and the interlayer dielectric layer 25A may remain as indicated by the reference numerals 22 and 25, respectively.

The plurality of pillars 26 are separated from one another by second trenches 27. The bodies 24A remain as indicated by the reference numeral 24, and the pillars 26 are formed on the bodies 24. The plurality of pillars 26 may have a matrix arrangement. Each pillar 26 may have four sidewalls. The sidewalls of each pillar 26 which oppose each other in any one direction (the first direction in which the pillars 26 are separated from one another by the first trenches 23) may contact the interlayer dielectric layer 25. That is to say, the interlayer dielectric layer 25 is formed between the pillars 26 which are arranged in the first direction. The other laterally opposing sidewalls (hereinafter, referred to as 'first sidewalls and second sidewalls') of the pillars 26 which are arranged in the second direction are exposed by the second trenches 27. The second trenches 27 extend in the direction crossing with the first trenches 23, and may have a depth shallower than the first trenches 23. Accordingly, the pillars 26 are formed in a plural number on each body 24. The plurality of bodies 24 are separated from one another by the first trenches 23, and the plurality of pillars 26 are separated from one another by the second trenches 27.

Figure 3C:
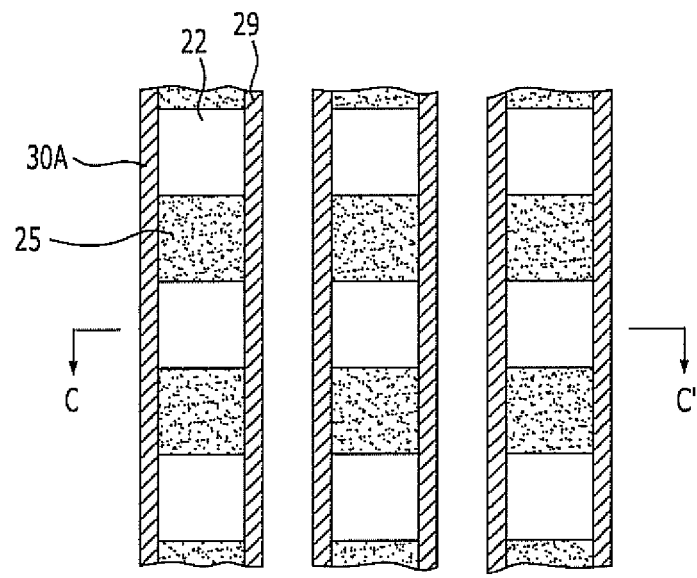
Figure 4C:
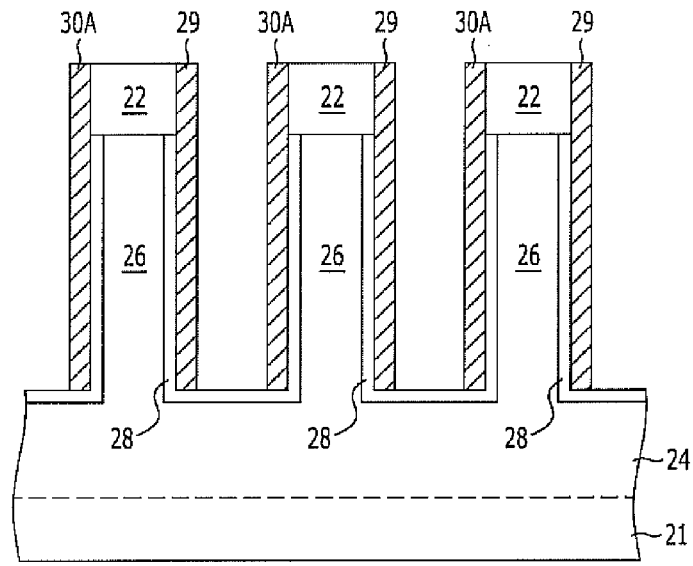

Referring to FIGS. 3C and 4C, a gate dielectric layer 28 is formed on the first sidewalls and the second sidewalls of the pillars 26. The gate dielectric layer 28 may be formed through oxidation such as thermal oxidation or plasma oxidation. The gate dielectric layer 28 may be formed on the entire surface through chemical vapor deposition (CVD) or atomic layer deposition (ALD). The gate dielectric layer 28 may include a silicon oxide, a high-k substance, or the like.

Next, first gate electrodes 29 and preliminary shield gate electrodes 30A are respectively formed on the first sidewalls and the second sidewalls of the pillars 26 which are formed with the gate dielectric layer 28. The preliminary shield gate electrodes 30A and the first gate electrodes 29 may extend in the first direction. In order to form the preliminary shield gate electrodes 30A and the first gate electrodes 29, an etch-back process may be performed after forming a first conductive layer on the entire surface. According to this fact, the preliminary shield gate electrodes 30A and the first gate electrodes 29 may be simultaneously formed. The first conductive layer may include an oxide, a metal nitride with low reactivity or a low resistance metal. For example, the preliminary shield gate electrodes 30A may include TiN, TiAlN, WN, TaN, W, Al, Ru, Pt, Au, or the like. Hereafter, in the present embodiment, the first conductive layer may be formed using a titanium nitride (TiN).

Figure 3D:
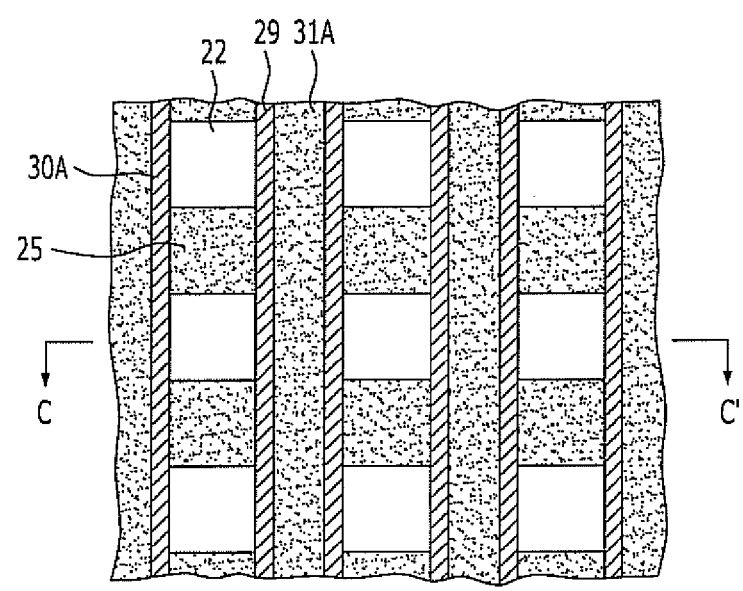
Figure 4D:
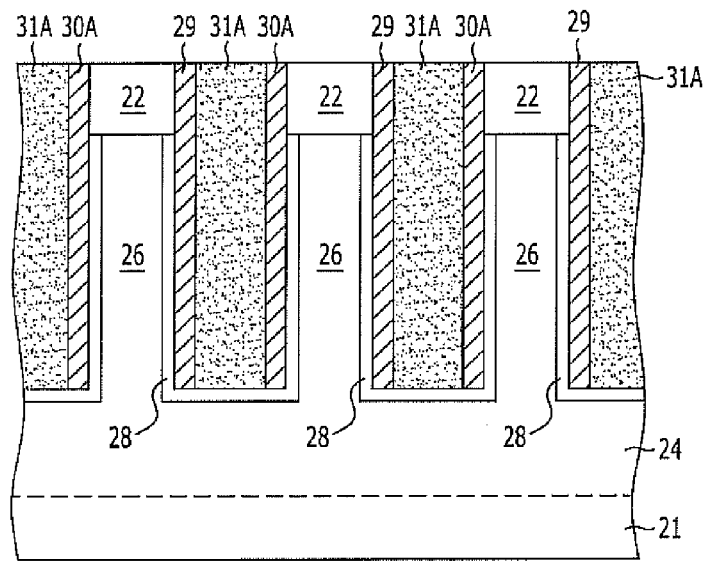

Referring to FIGS. 3D and 4D, a first dielectric layer 31A is formed to fill the spaces between the pillars 26 which are formed with the first gate electrodes 29 and the preliminary shield gate electrodes 30A. The first dielectric layer 31A may include an oxide such as a silicon oxide. The first dielectric layer 31A may be planarized through CMP or the like until the surfaces of the hard mask layer patterns 22 are exposed.

Figure 3E:
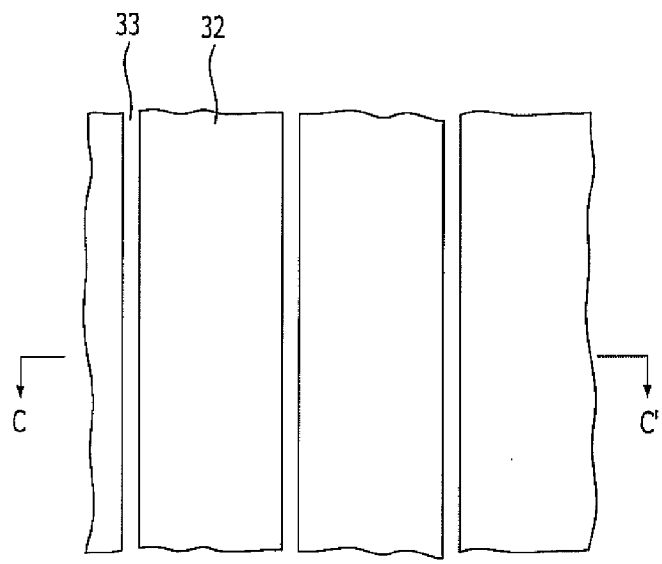
Figure 4E:
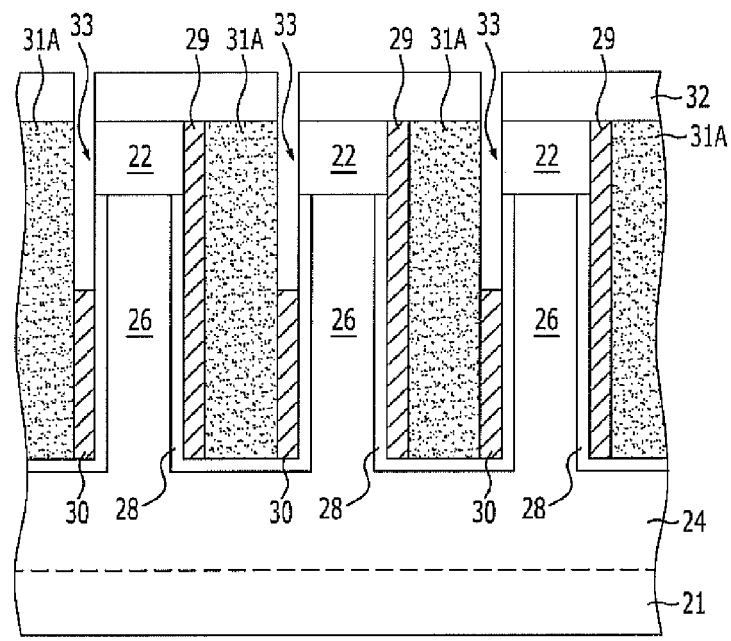

Referring to FIGS. 3E and 4E, photoresist patterns 32 are formed. The photoresist patterns 32 may have shapes which expose the upper surfaces of the preliminary shield gate electrodes 30A.

The preliminary shield gate electrodes 30A are etched by a predetermined depth using the photoresist patterns 32 as an etch barrier. According to this fact, shield gate electrodes 30 are formed, and gaps 33 are defined on the shield gate electrodes 30.

By forming the shield gate electrodes 30 as described above, double gate structures including the shield gate electrodes 30 and the first gate electrodes 29 are formed in a self-aligned manner on the first sidewalls and the second sidewalls of the pillars 26. The shield gate electrodes 30 and the first gate electrodes 29 have a height difference. While the first gate electrodes 29 serve as the gate electrodes of vertical channel transistors, the shield gate electrodes 30 do not serve as gate electrodes. The shield gate electrodes 30 may perform a function of shielding electric fields by the neighbor first gate electrodes 29, by which it is possible to minimize a neighbor gate effect.

Figure 3F:
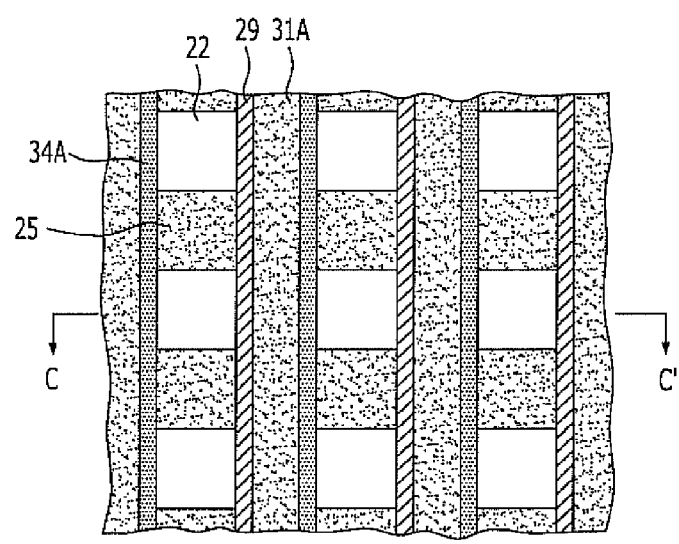
Figure 4F:
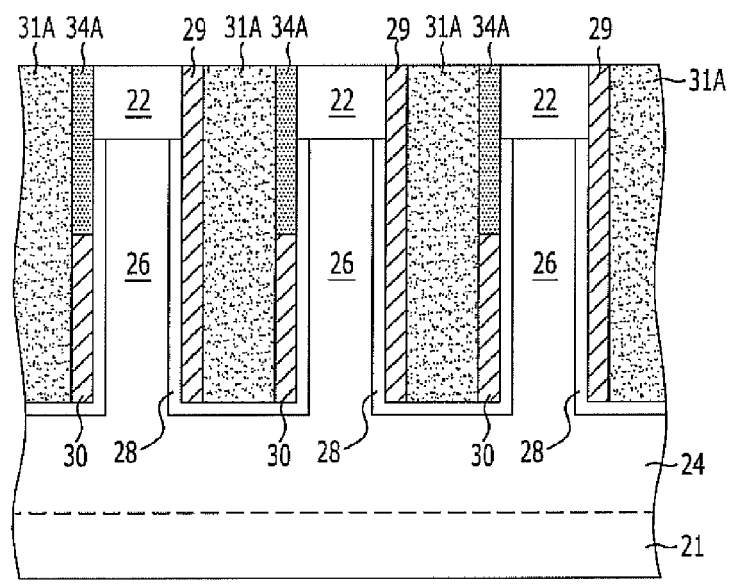

Referring to FIGS. 3F and 4F, a second dielectric layer 34A is formed to fill the gaps 33. The second dielectric layer 34A may include an oxide such as a silicon oxide. Also, the second dielectric layer 34A may include a nitride such as a silicon nitride. The second dielectric layer 34A may be planarized through CMP or the like until the surfaces of the hard mask layer patterns 22 are exposed. The second dielectric layer 34A is formed on the shield gate electrodes 30.

Figure 3G:
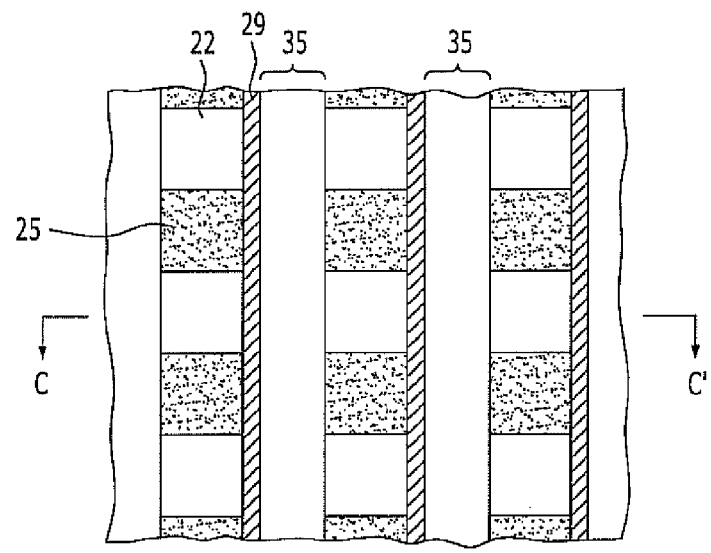
Figure 4G:
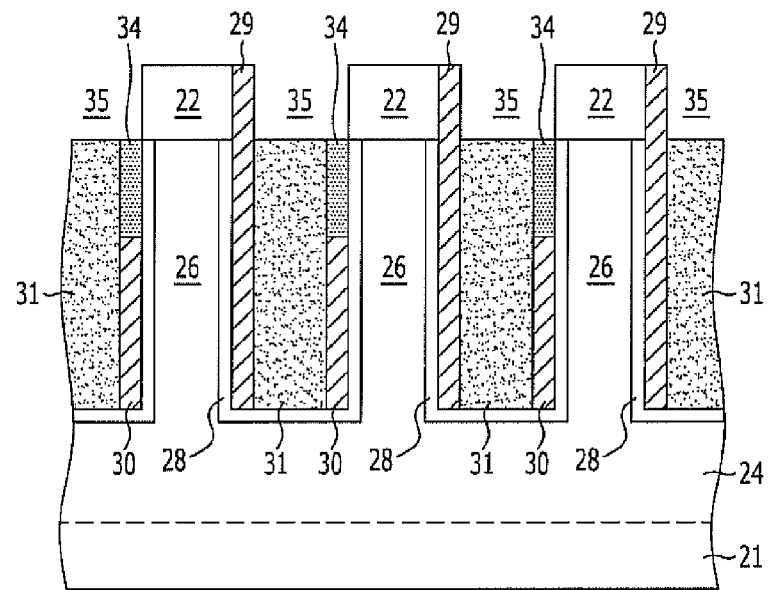

Referring to FIGS. 3G and 4G, the first dielectric layer 31A and the second dielectric layer 34A are recessed by a predefined depth. According to this fact, recesses 35 are defined. The depth of the recesses 35 may be the same as the height of the hard mask layer patterns 22. The depth of the recesses 35 may be controlled to be lower than the upper surfaces of the pillars 26. The recesses 35 may be defined between neighboring hard mask layer patterns 22. The upper portions of the sidewalls of the first gate electrodes 29 are exposed due to defining the recesses 35, and the first and second dielectric layers 31 and 34 remain on the bottoms of the recesses 35. The recesses 35 are defined such that the shield gate electrodes 30 are not exposed.

Figure 3H:
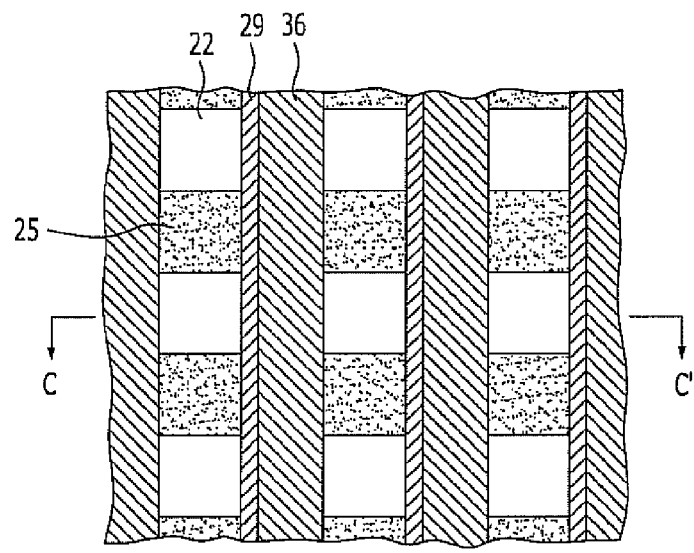
Figure 4H:
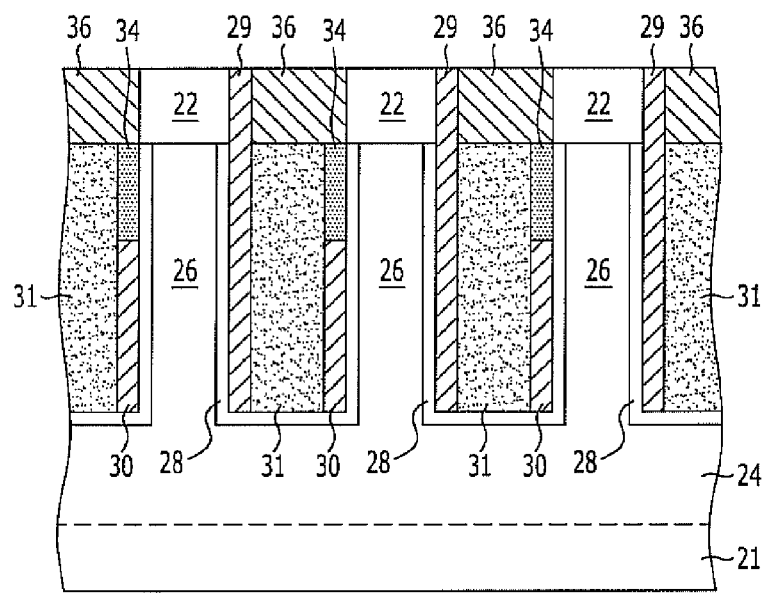

Referring to FIGS. 3H and 4H, second gate electrodes 36 are formed to fill the recesses 35. The second gate electrodes 36 may extend in the first direction. In order to form the second gate electrodes 36, an etch-back process may be performed after forming a second conductive layer on the entire surface. The second conductive layer may include W, Al, Ru, Pt, Au, or the like. Hereafter, the second conductive layer may be formed of tungsten (W). The second gate electrodes 36 may have structures which are buried in the recesses 35.

The second gate electrodes 36 are connected with the first gate electrodes 29, and the first and second gate electrodes 29 and 36 and the shield gate electrodes 30 may be isolated by the first and second dielectric layers 31 and 34.

Figure 3I:
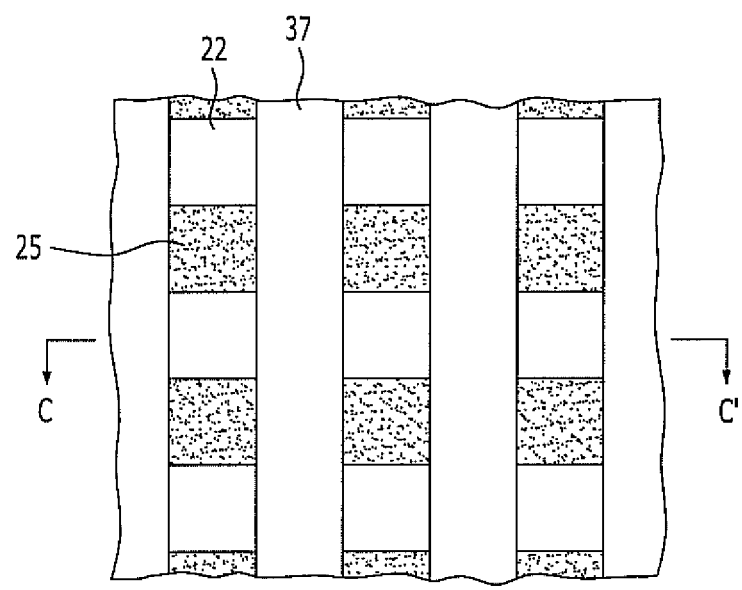
Figure 4I:
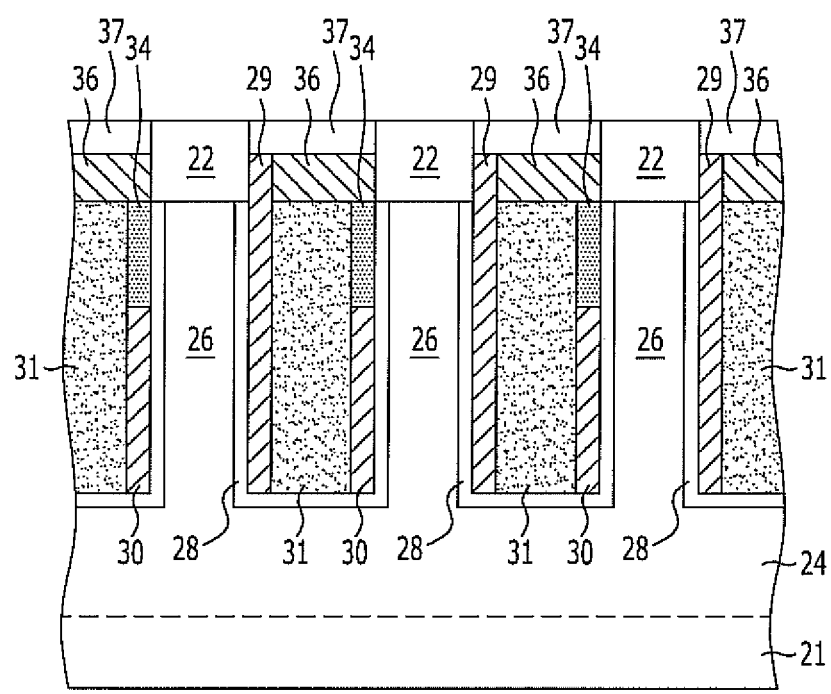

Referring to FIGS. 3I and 4I, the first and second gate electrodes 29 and 36 are recessed by a predetermined depth. A capping layer 37 is formed to fill recessed regions. The capping layer 37 may include an oxide layer such as a silicon oxide. By forming the capping layer 37 in this way, the first and second gate electrodes 29 and 36 are isolated from surrounding structures.

Figure 5A:
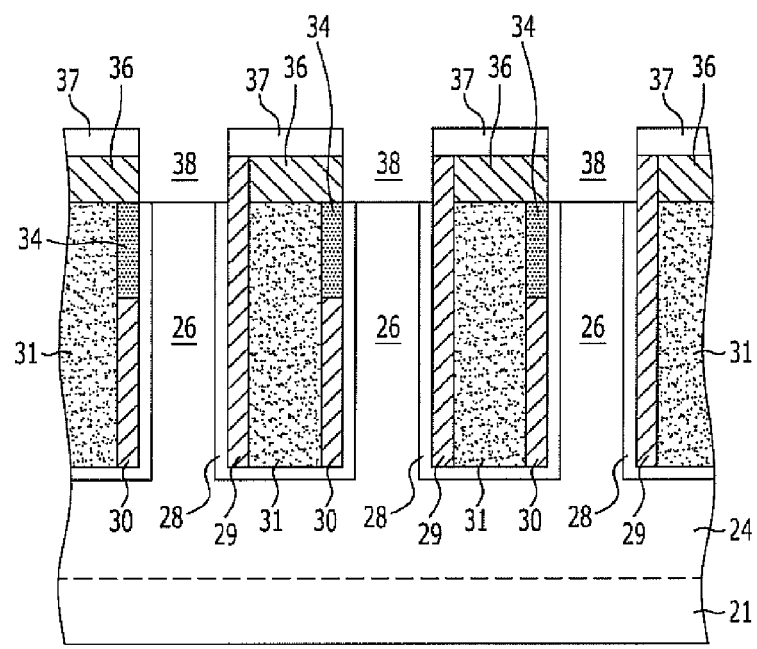
FIGS. 5A to 5C are views explaining a method for fabricating a capacitor of the semiconductor device to which the vertical channel transistors in accordance with the first embodiment of the present invention are applied.
Figure 5B:
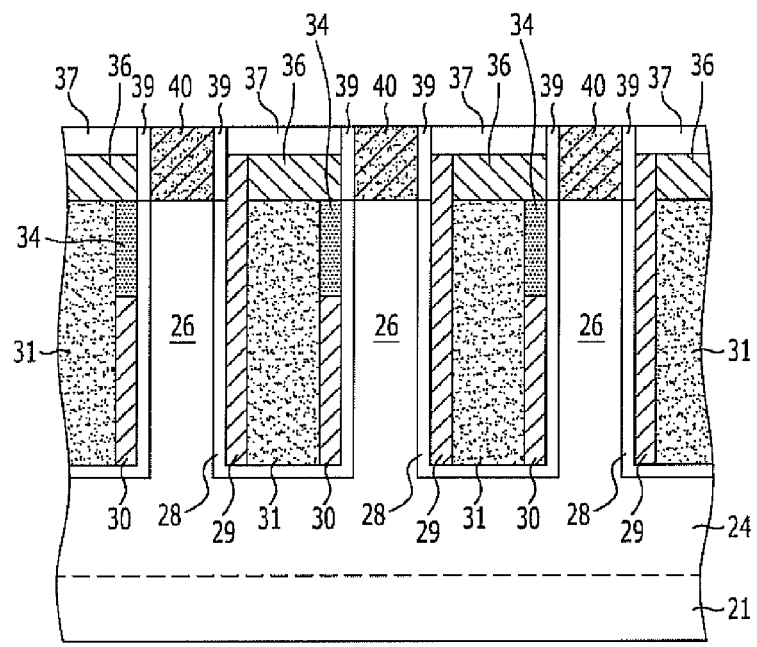
Figure 5C:
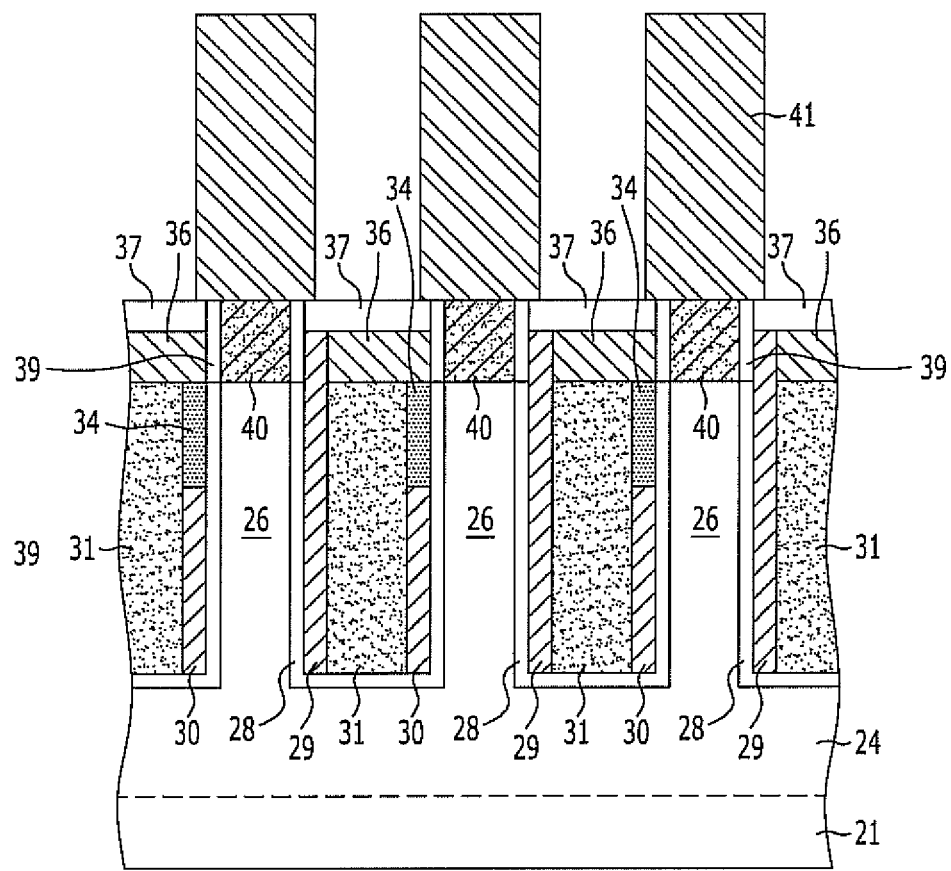

FIGS. 5A to 5C are views explaining a method for fabricating a capacitor of the semiconductor device to which the vertical channel transistors in accordance with the first embodiment of the present invention are applied.

Referring to FIG. 5A, contact holes 38 are defined by removing the hard mask layer patterns 22. Since the interlayer dielectric layer 25 and the capping layer 37 are a silicon oxide and the hard mask layer patterns 22 are a silicon nitride, the hard mask layer patterns 22 may be removed through a wet etching using a phosphoric acid. According to this fact, the contact holes 38 are defined in a self-defined manner by the capping layer 37 and the interlayer dielectric layer 25. The upper surfaces of the pillars 26 are exposed on the bottoms of the contact holes 38.

Referring to FIG. 5B, spacers 39 are formed to surround the sidewalls of the contact holes 38. The spacers 39 may include an oxide such as a silicon oxide. In order to form the spacers 39, an etch-back process may be performed after depositing a silicon oxide.

Contact plugs 40 are formed to be buried in the contact holes 38. The contact plugs 40 may include a polysilicon, a metal or the like. For example, after depositing a polysilicon to fill the contact holes 38, a planarization process may be performed. The spacers 39 surround the sidewalls of the contact plugs 40. While not shown, ion implantation for forming sources/drains may be carried out before forming the contact plugs 40.

Referring to FIG. 5C, storage nodes 41 of capacitors are formed on the contact plugs 40. The storage nodes 41 may have pillar shapes. In another embodiment, the storage nodes 41 may have cylinder shapes. As a method for forming the storage nodes 41, well-known methods may be adopted. For example, after forming a mold layer (not shown), open parts are formed by etching the mold layer, and the storage nodes 41 are formed in the open parts. Then, the mold layer is removed through a full dip-out process.

While not shown, supporters for supporting the outer walls of the storage nodes 41 may be additionally formed. For example, a substance for supporters is formed on the mold layer, and supporters may be formed by partially etching the substance for supporters before performing the full dip-out process. Furthermore, a dielectric layer and plate nodes may be additionally formed on the storage nodes 41.

Figure 6:
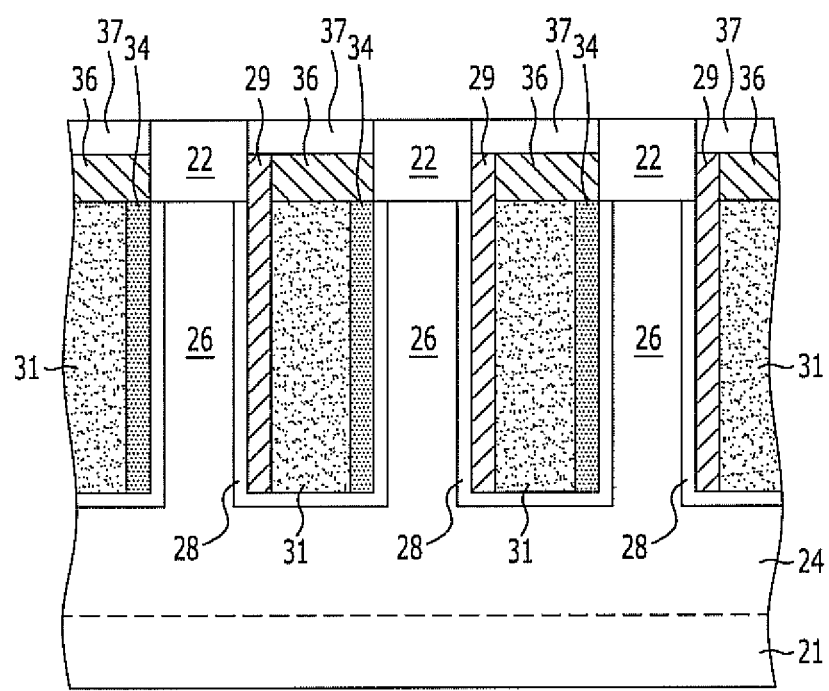
FIG. 6 is a view illustrating vertical channel transistors in accordance with a second embodiment of the present invention.

FIG. 6 is a view illustrating vertical channel transistors in accordance with a second embodiment of the present invention.

Referring to FIG. 6, vertical channel transistors in accordance with a first embodiment of the present invention may include pillars 26, first gate electrodes 29, and second gate electrodes 36.

First, a plurality of pillars 26 are formed on a semiconductor substrate 21 to vertically project from the surface of the semiconductor substrate 21. Bodies 24 may be further formed under the pillars 26. The pillars 26 may vertically project from the surfaces of the bodies 24. Hard mask layer patterns 22 may be formed on the pillars 26. The plurality of pillars 26 may have a matrix arrangement. The pillars 26 may be quadrangular pillars each of which has a plurality of sidewalls. The pillars 26 may be arranged to be isolated by an interlayer dielectric layer in a first direction Y, and the first and second sidewalls of the pillars 26 laterally opposing each other may be exposed in a second direction X. Each pillar 26 may have a source region, a drain region and a channel region (not numbered). The drain region may be formed in top portion of the pillar 26, and the source region may be formed in bottom portion of the pillar 26. The channel region may be formed between the drain region and the source region. The semiconductor substrate 21, the bodies 24 and the pillars 26 include a silicon-containing substance. For example, a silicon substrate or a silicon-germanium substrate may be used. Accordingly, the pillar 26 may include a semiconductor pillar, a silicon pillar or a silicon-germanium pillar.

A gate dielectric layer 28 is formed on the first sidewalls and the second sidewalls of the pillars 26. The gate dielectric layer 28 may include a silicon oxide or a high-k substance.

The first gate electrodes 29 are formed on the gate dielectric layer 28 to cover the first sidewalls of the pillars 26. The first gate electrodes 29 are vertical gate electrodes. The first gate electrodes 29 are not formed on the second sidewalls of the pillars 26. Also, unlike the first embodiment, shield gate electrodes to cover the second sidewalls are not formed.

The second gate electrodes 36 which are connected to the upper portions of the sidewalls of the first gate electrodes 29 are formed between the plurality of pillars 26. The second gate electrodes 36 may serve as word lines. The second gate electrodes 36 may have shapes which are buried in the upper portions of the spaces defined between the plurality of pillars 26. For example, the second gate electrodes 36 may be buried between the hard mask layer patterns 22. A first dielectric layer 31 and a second dielectric layer 34 may be formed between the first gate electrodes 29 and adjoining pillars 26. The first dielectric layer 31 and the second dielectric layer 34 may be recessed by a predetermined depth, and the second gate electrodes 36 may be formed on the first dielectric layer 31 and the second dielectric layer 34 which are recessed.

The first gate electrodes 29 have line-shaped vertical gate structures which extend in the first direction Y. The second gate electrodes 36 have shapes which extend in the first direction Y in the same manner as the first gate electrodes 29. The first gate electrodes 29 may include a metal nitride or a low resistance metal. For example, the first gate electrodes 29 may include TiN, TiAlN, WN, TaN, W, Al, Ru, Pt, Au, or the like. The second gate electrodes 36 may include W, Al, Ru, Pt, Au, or the like. The first gate electrodes 29 and the second gate electrodes 36 may be recessed by a predetermined depth, and a capping layer 37 may be additionally formed on the first gate electrodes 29 and the second gate electrodes 36 which are recessed.

According to FIG. 6, the vertical channel transistors in accordance with the second embodiment of the present invention have single gate structures in which the first gate electrodes 29 are formed on only one sidewalls of the pillars 26. The first gate electrodes 29 become the gate electrodes of vertical channel transistors. Furthermore, as only the first gate electrodes 29 are formed on the sidewalls of the pillars 26, the first gate electrodes 29 may be formed to have a substantial thickness. According to this fact, gate resistance may be reduced. In particular, because only the first gate electrodes 29 are formed without forming shield gate electrodes, a neighbor gate effect may be originally prevented.

Figure 7:
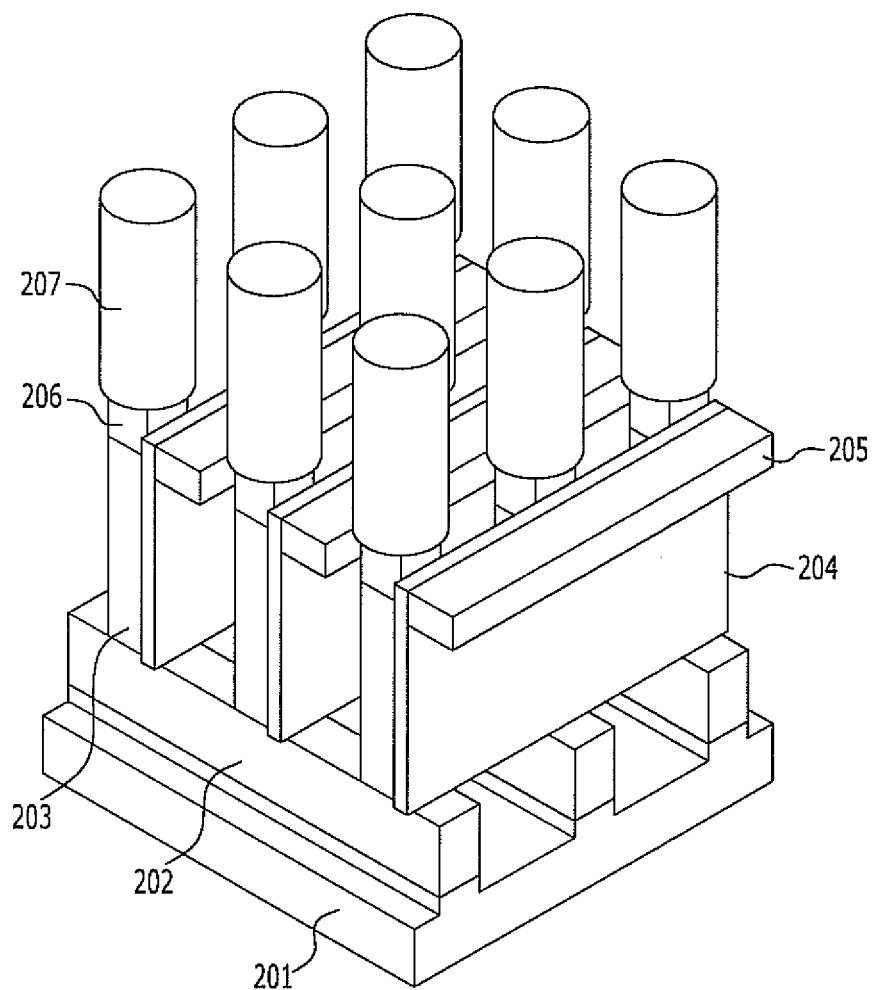
FIG. 7 is a perspective view illustrating a semiconductor device to which the vertical channel transistors in accordance with the second embodiment of the present invention are applied.

FIG. 7 is a perspective view illustrating a semiconductor device to which the vertical channel transistors in accordance with the second embodiment of the present invention are applied.

Referring to FIG. 7, vertical channel transistors include first gate electrodes 204, second gate electrodes 205, and pillars 203. As buried bit lines 202 and capacitors 207 are connected to the vertical channel transistors, a semiconductor device such as a DRAM may be realized. The buried bit lines 202 may be electrically connected with the bottom portions of the pillars 203. The buried bit lines 202 may be vertically formed on a semiconductor substrate 201 and may extend in a first direction. The first gate electrodes 204 and the second gate electrodes 205 may extend in a second direction perpendicularly crossing with the first direction. The capacitors 207 may be electrically connected with the top portions of the pillars 203. Contact plugs 206 may be additionally formed between the capacitors 207 and the pillars 203. While not shown, the capacitors 207 may include storage nodes, a dielectric layer and plate nodes. The vertical channel transistors may be applied not only to a memory such as a DRAM but also to a nonvolatile memory such as a flash memory.

FIGS. 8A to 8E are views explaining an exemplary method for fabricating the vertical channel transistors in accordance with the second embodiment of the present invention. Unlike the first embodiment, when defining gaps, shield gate electrodes are entirely removed. Hereinbelow, reference will be made to FIGS. 4A to 4D for processes before defining the gaps.

Figure 8A:
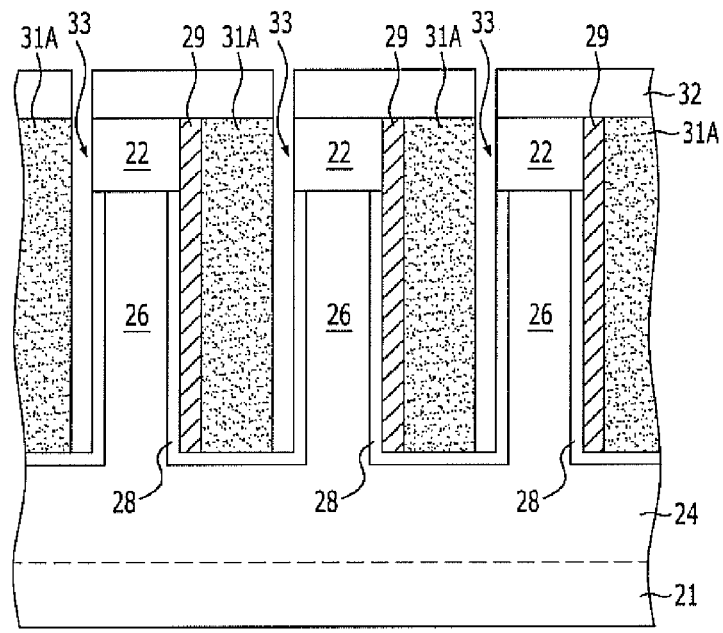
FIGS. 8A to 8E are views explaining an exemplary method for fabricating the vertical channel transistors in accordance with the second embodiment of the present invention.

Referring to FIG. 8A, photoresist patterns 32 are formed. The photoresist patterns 32 may have shapes which expose the upper surfaces of the preliminary shield gate electrodes 30A.

The exposed preliminary shield gate electrodes 30A are entirely removed using the photoresist patterns 32 as an etch barrier. According to this fact, gaps 33 are defined. Unlike the first embodiment, in the second embodiment, as the preliminary shield gate electrodes 30A are entirely removed, shield gate electrodes are not formed. The preliminary shield gate electrodes 30A removed in this way may be sacrificial gate electrodes.

By entirely removing the preliminary shield gate electrodes 30A as described above, only the first gate electrodes 29 remain on the one sidewalls of the pillars 26.

The first gate electrodes 29 serve as the gate electrodes of the vertical channel transistors. By not forming shield gate electrodes, a neighbor gate effect by neighbor gates may be originally prevented.

Figure 8B:
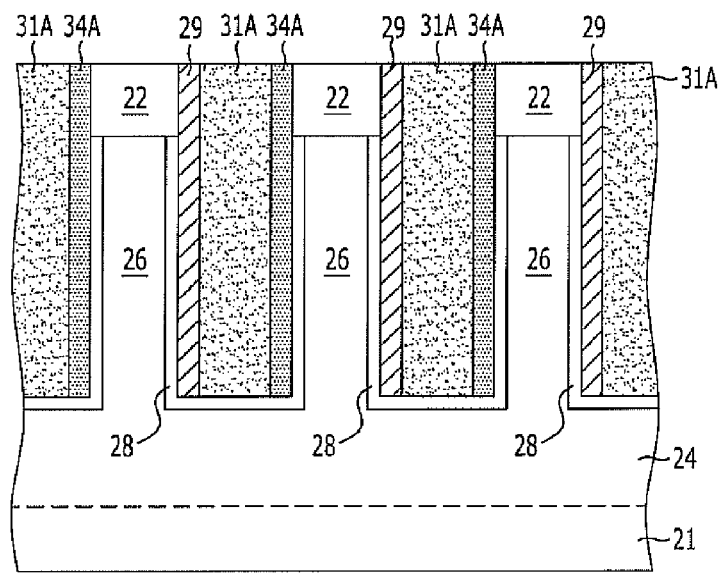

Referring to FIG. 8B, a second dielectric layer 34A is formed to fill the gaps 33. The second dielectric layer 34A may include an oxide such as a silicon oxide. Also, the second dielectric layer 34A may include a nitride such as a silicon nitride. The second dielectric layer 34A may be planarized through CMP or the like until the surfaces of the hard mask layer patterns 22 are exposed.

Figure 8C:
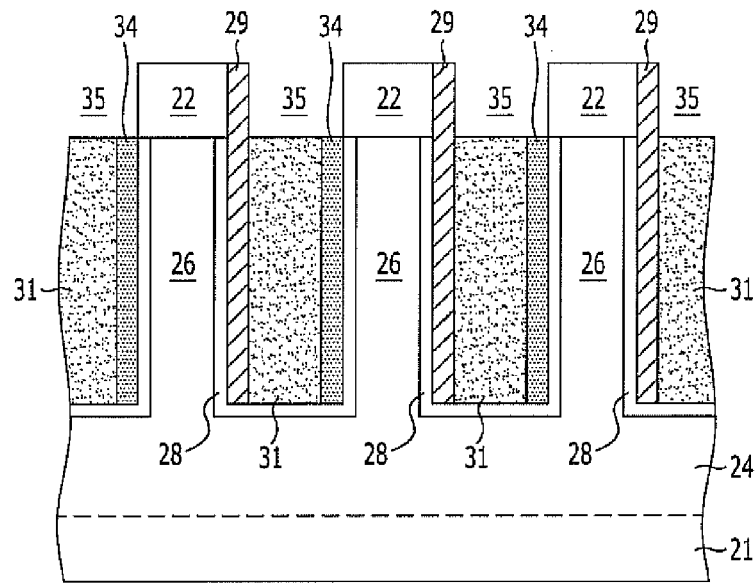

Referring to FIG. 8C, the first dielectric layer 31A and the second dielectric layer 34A are recessed by a predefined depth. According to this fact, recesses 35 are defined. The depth of the recesses 35 may be the same as the height of the hard mask layer patterns 22. The depth of the recesses 35 may be controlled to be lower than the upper surfaces of the pillars 26. The recesses 35 may be defined between neighboring hard mask layer patterns 22. The upper portions of the sidewalls of the first gate electrodes 29 are exposed due to defining the recesses 35, and the first and second dielectric layers 31 and 34 remain on the bottoms of the recesses 35.

Figure 8D:
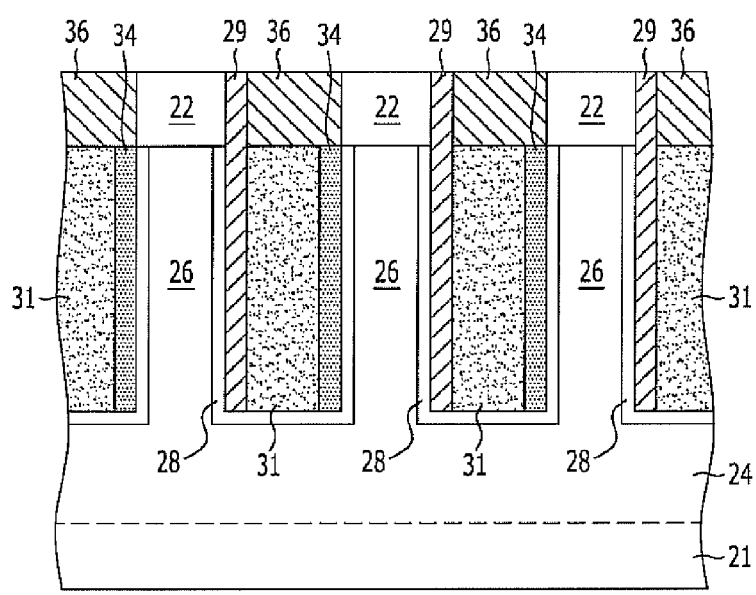

Referring to FIG. 8D, second gate electrodes 36 are formed to fill the recesses 35. The second gate electrodes 36 may extend in the first direction. In order to form the second gate electrodes 36, an etch-back process may be performed after forming a second conductive layer on the entire surface. The second conductive layer may include W, Al, Ru, Pt, Au, or the like. The second conductive layer may be formed of tungsten (W). The second gate electrodes 36 may have structures which are buried in the recesses 35.

The second gate electrodes 36 are connected with the upper portions of the sidewalls of the first gate electrodes 29, and the first and second gate electrodes 29 and 36 and adjoining pillars 26 may be isolated by the first and second dielectric layers 31 and 34.

Figure 8E:
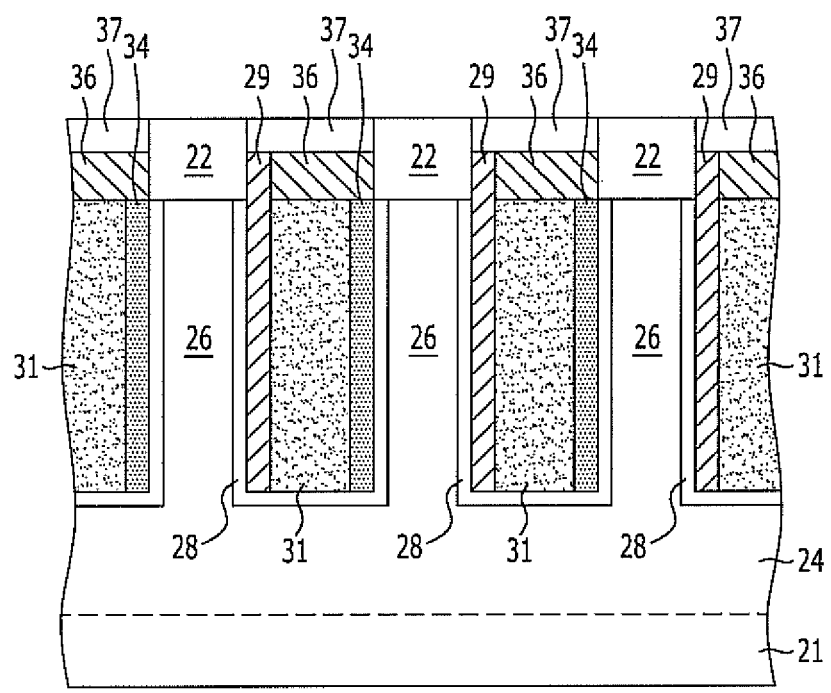

Referring to FIG. 8E, the first and second gate electrodes 29 and 36 are recessed by a predetermined depth. A capping layer 37 is formed to fill recessed regions. The capping layer 37 may include an oxide layer such as a silicon oxide. By forming the capping layer 37 in this way, the first and second gate electrodes 29 and 36 are isolated from surrounding structures.

Contact plugs and capacitors are subsequently formed. Reference may be made to FIGS. 5A to 5C for a method for forming the contact plugs and the capacitors.

Figure 9:
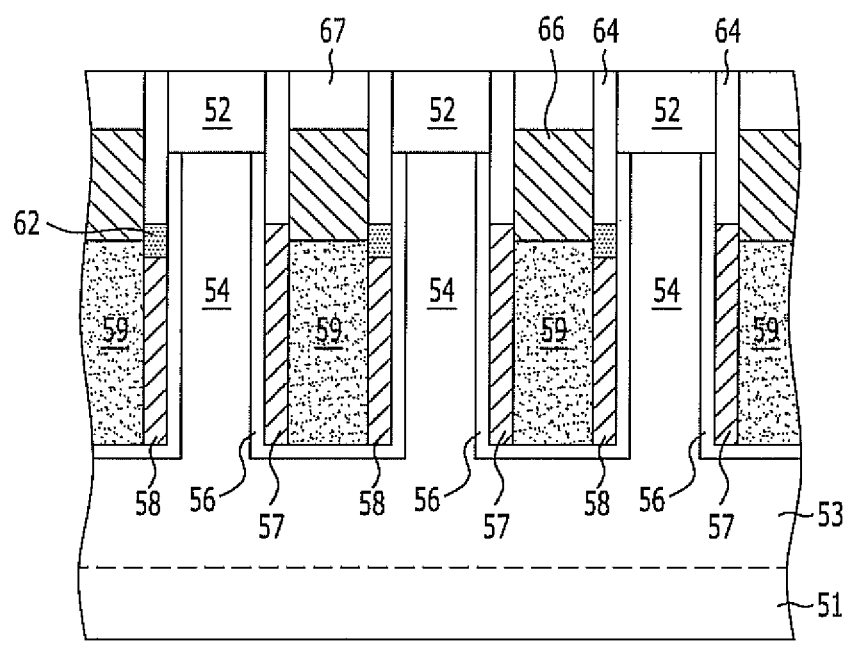
FIG. 9 is a view illustrating vertical channel transistors in accordance with a third embodiment of the present invention.

FIG. 9 is a view illustrating vertical channel transistors in accordance with a third embodiment of the present invention.

Referring to FIG. 9, vertical channel transistors in accordance with a third embodiment of the present invention may include pillars 54, first gate electrodes 57, shield gate electrodes 58, and second gate electrodes 66.

First, a plurality of pillars 54 are formed on a semiconductor substrate 51 to vertically project from the surface of the semiconductor substrate 51. Bodies 53 may be further formed under the pillars 54. The pillars 54 may vertically project from the surfaces of the bodies 53. The plurality of pillars 54 may have a matrix arrangement. The pillars 54 may be quadrangular pillars each of which has a plurality of sidewalls. The pillars 54 may be arranged to be isolated by an interlayer dielectric layer (not shown) in a first direction Y, and the first and second sidewalls of the pillars 54 laterally opposing each other may be exposed in a second direction X. Each pillar 54 may have a source region, a drain region and a channel region (not numbered). The drain region may be formed in top portion of the pillar 54, and the source region may be formed in bottom portion of the pillar 54. The channel region may be formed between the drain region and the source region. The semiconductor substrate 51, the bodies 53 and the pillars 54 include a silicon-containing substance. For example, a silicon substrate or a silicon-germanium substrate may be used. Accordingly, the pillar 54 may include a semiconductor pillar, a silicon pillar or a silicon-germanium pillar.

A gate dielectric layer 56 is formed on the first sidewalls and the second sidewalls of the pillars 54. The gate dielectric layer 56 may include a silicon oxide or a high-k substance.

The first gate electrodes 57 are formed on the gate dielectric layer 56 to cover the first sidewalls of the pillars 54. The first gate electrodes 57 may be vertical gate electrodes. The shield gate electrodes 58 are formed to cover the second sidewalls of the pillars 54. The shield gate electrodes 58 may be formed to have a height lower than the first gate electrodes 57. Also, the first gate electrodes 57 and the shield gate electrodes 58 may be formed to have heights lower than the height of the pillars 54.

The second gate electrodes 66 which are connected to the upper portions of the sidewalls of the first gate electrodes 57 are formed between the plurality of pillars 54. The second gate electrodes 66 may serve as word lines. The second gate electrodes 66 may have shapes which are buried in the upper portions of the spaces defined between the plurality of pillars 54. For example, the second gate electrodes 66 may be buried between hard mask layer patterns 52. A first dielectric layer 59 may be formed between the first gate electrodes 57 and the shield gate electrodes 58, and a second dielectric layer 62 may be formed on the shield gate electrodes 58. The first dielectric layer 59 and the second dielectric layer 62 may be recessed by predetermined depths, and the second gate electrodes 66 may be formed on the first dielectric layer 59 which is recessed. The shield gate electrodes 58 neighboring the second gate electrodes 66 are isolated by the second dielectric layer 62. Spacers 64 may be formed on the second dielectric layer 62 and the first gate electrodes 57. The second gate electrodes 66 may be isolated from the surrounding structures by the spacers 64. A capping layer 67 may be additionally formed on the second gate electrodes 66.

The first gate electrodes 57 and the shield gate electrodes 58 have line-shaped vertical gate structures which extend in the first direction Y. The second gate electrodes 66 have shapes which extend in the first direction Y in the same manner as the first gate electrodes 57. The first gate electrodes 57 and the shield gate electrodes 58 may include a metal nitride or a low resistance metal. For example, the first gate electrodes 57 and the shield gate electrodes 58 may include TiN, TiAlN, WN, TaN, W, Al, Ru, Pt, Au, or the like. The second gate electrodes 66 may include W, Al, Ru, Pt, Au, or the like.

According to FIG. 9, the vertical channel transistors in accordance with the third embodiment of the present invention have double gate structures in which the shield gate electrodes 58 and the first gate electrodes 57 are formed on both sidewalls of the pillars 54. The first gate electrodes 57 become the gate electrodes of vertical channel transistors. Furthermore, as only the first gate electrodes 57 are formed on the sidewalls of the pillars 54, the first gate electrodes 57 may be formed to have a substantial thickness. According to this fact, gate resistance may be reduced. The shield gate electrodes 58 function to shield electric fields by neighbor gates, by which a neighbor gate effect may be minimized.

Figure 10:
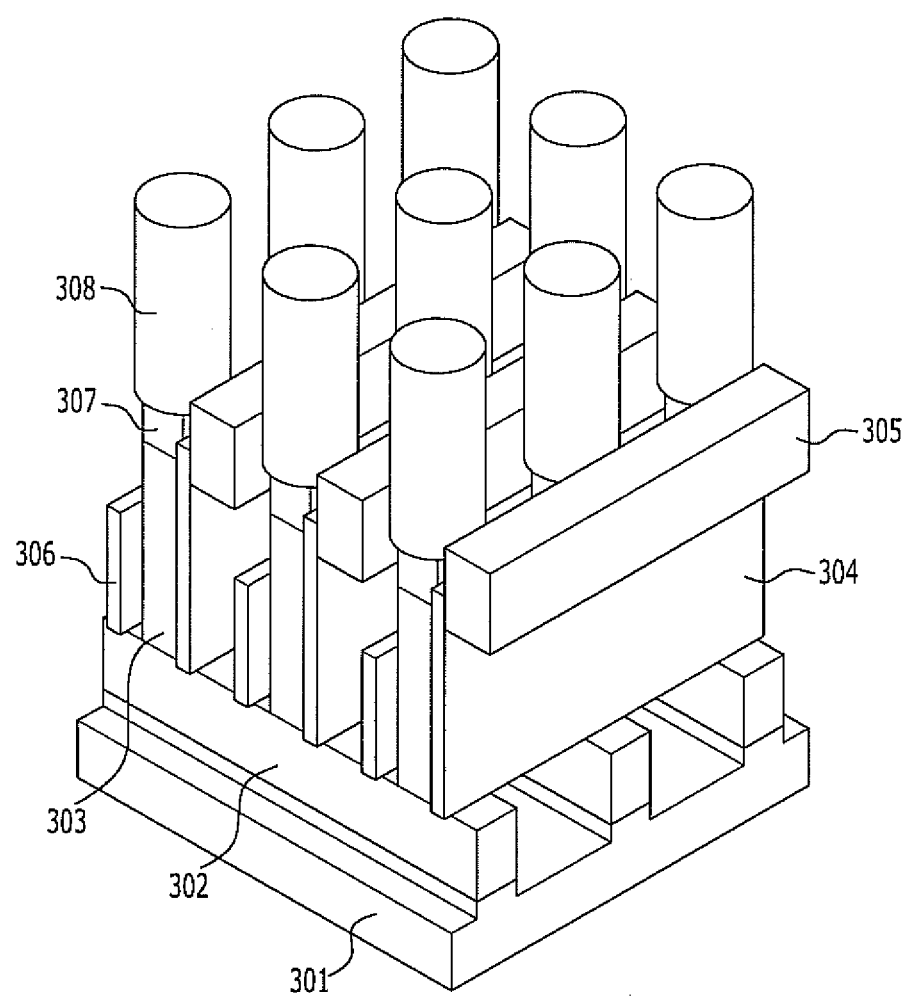
FIG. 10 is a perspective view illustrating a semiconductor device to which the vertical channel transistors in accordance with the third embodiment of the present invention are applied.

FIG. 10 is a perspective view illustrating a semiconductor device to which the vertical channel transistors in accordance with the third embodiment of the present invention are applied.

Referring to FIG. 10, vertical channel transistors include first gate electrodes 304, second gate electrodes 305, and pillars 303. Shield gate electrodes 306 are formed on the sidewalls of the pillars 303. As buried bit lines 302 and capacitors 308 are connected to the vertical channel transistors, a semiconductor device such as a DRAM may be realized. The buried bit lines 302 may be electrically connected with the bottom portions of the pillars 303. The buried bit lines 302 may be vertically formed on a semiconductor substrate 301 and may extend in a first direction. The first gate electrodes 304 and the second gate electrodes 305 may extend in a second direction perpendicularly crossing with the first direction. The capacitors 308 may be electrically connected with the top portions of the pillars 303. Contact plugs 307 may be additionally formed between the capacitors 308 and the pillars 303. While not shown, the capacitors 308 may include storage nodes, a dielectric layer and plate nodes. The vertical channel transistors may be applied not only to a memory such as a DRAM but also to a nonvolatile memory such as a flash memory.

FIGS. 11A to 11J are views explaining an exemplary method for fabricating the vertical channel transistors in accordance with the third embodiment of the present invention.

Figure 11A:
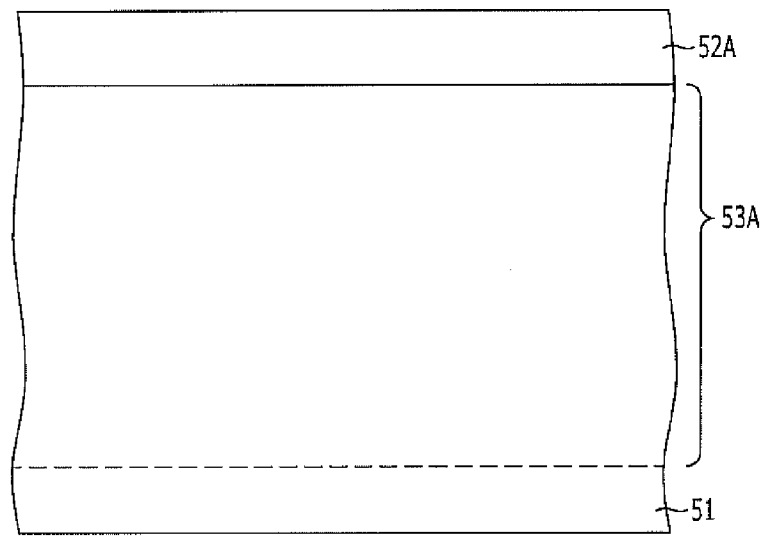
FIGS. 11A to 11J are views explaining an exemplary method for fabricating the vertical channel transistors in accordance with the third embodiment of the present invention.

Referring to FIG. 11A, hard mask layer patterns 52A are formed on a semiconductor substrate 51. The semiconductor substrate 51 includes a silicon-containing substance. For example, the semiconductor substrate 51 includes a silicon substrate or a silicon-germanium substrate. The hard mask layer patterns 52A include a nitride such as a silicon nitride. Also, the hard mask layer patterns 52A may include a silicon oxide or amorphous carbon. The hard mask layer patterns 52A may have a multi-layered structure including an oxide or a nitride. For example, the hard mask layer patterns 52A may be stacked in order of a hard mask (HM) nitride and a hard mask oxide. Also, the hard mask layer patterns 52A may be stacked in order of a hard mask nitride, a hard mask oxide, a hard mask silicon oxynitride and hard mask carbon. In the case where a hard mask nitride is included, a pad oxide may be additionally formed between the semiconductor substrate 51 and the hard mask layer patterns 52A. The pad oxide may include a silicon oxide. The hard mask layer patterns 52A may be formed by being patterned using photoresist patterns after forming a hard mask layer. The hard mask layer patterns 52A may be formed to extend in a second direction.

By etching the semiconductor substrate 51 by a predetermined depth using the hard mask layer patterns 52A as an etch mask, a plurality of bodies 53A are formed. The bodies 53A are separated from one another by first trenches (not shown). The plurality of bodies 53A are separated from one another by the first trenches. The bodies 53A are formed to vertically extend from the surface of the semiconductor substrate 51. The bodies 53A have laterally opposing sidewalls. When viewed from the top, the bodies 53A have linear shapes which are separated from one another by the first trenches. For example, the bodies 53A have linear structures which extend in the second direction. Reference may be made to the first trenches 23 of FIG. 3A for the first trenches.

By forming the bodies 53A as described above, a plurality of structures including the bodies 53A and the hard mask layer patterns 52A are formed on the semiconductor substrate 51. The plurality of structures are separated from one another by the first trenches. While not shown, after defining the first trenches, buried bit lines (BBL) may be additionally formed in the bodies 53A using a substance such as a metal nitride. This will be described later.

Next, an interlayer dielectric layer (not shown) is formed to fill the spaces between the bodies 53A. The interlayer dielectric layer may include an oxide layer such as a silicon oxide. The interlayer dielectric layer may be planarized through CMP (chemical mechanical polishing) or the like until the surfaces of the hard mask layer patterns 22A are exposed. Reference may be made to the interlayer dielectric layer 25A of FIG. 3A for the interlayer dielectric layer.

Figure 11B:
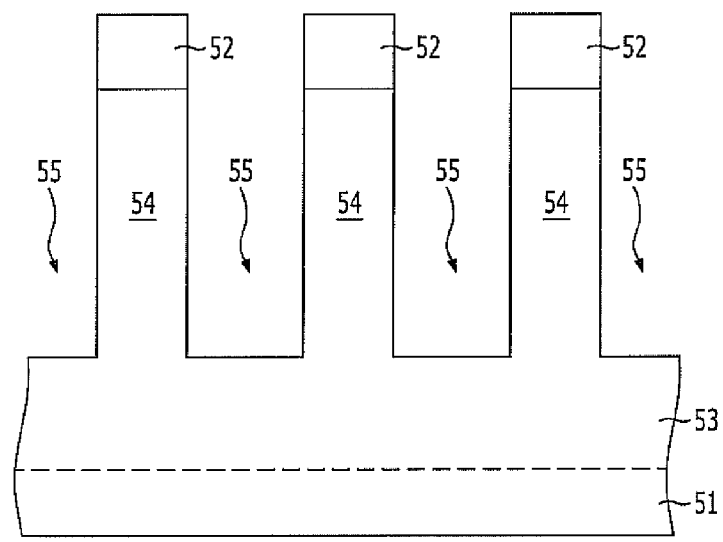

Referring to FIG. 11B, photoresist patterns (not shown) are formed to extend in a direction crossing with the bodies 53A, that is, a first direction. The hard mask layer patterns 52A and the bodies 53A are etched using the photoresist patterns as an etch barrier. According to this fact, a plurality of pillars 54 are formed. When etching the bodies 53A, the hard mask layer patterns 52A may also be etched. Accordingly, the hard mask layer patterns 52A may remain as indicated by the reference numeral 52.

The plurality of pillars 54 are separated from one another by second trenches 55. The bodies 53A remain as indicated by the reference numeral 53, and the pillars 54 are formed on the bodies 53. The plurality of pillars 54 may have a matrix arrangement. Each pillar 54 may have four sidewalls. The sidewalls of each pillar 54 which oppose each other in any one direction (the first direction in which the pillars 54 are separated from one another by the first trenches) may contact the interlayer dielectric layer. That is to say, the interlayer dielectric layer is formed between the pillars 54 which are arranged in the first direction. The other laterally opposing sidewalls (hereinafter, referred to as 'first sidewalls and second sidewalls') of the pillars 54 which are arranged in the second direction are exposed by the second trenches 55. The second trenches 55 extend in the direction crossing with the first trenches, and may have a depth shallower than the first trenches. Accordingly, the pillars 54 are formed in a plural number on each body 53. The plurality of bodies 53 are separated from one another by the first trenches, and the plurality of pillars 54 are separated from one another by the second trenches 55.

Figure 11C:
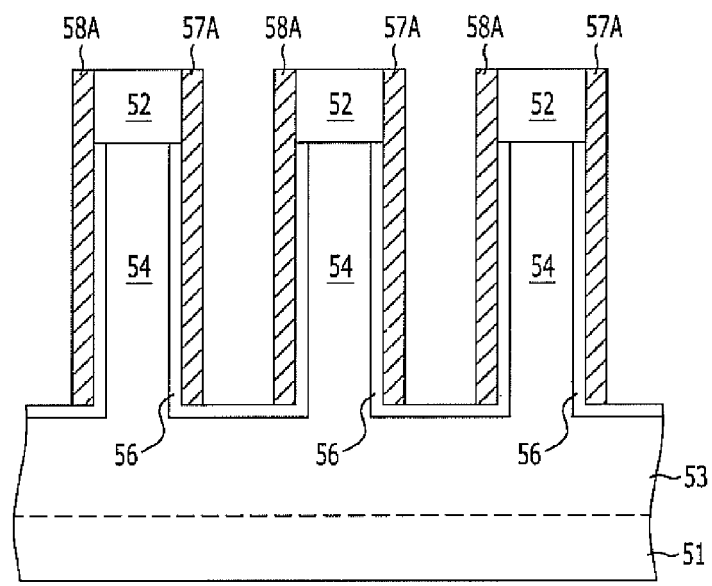

Referring to FIG. 11C, a gate dielectric layer 56 is formed on the first sidewalls and the second sidewalls of the pillars 54. The gate dielectric layer 56 may be formed through oxidation such as thermal oxidation or plasma oxidation. The gate dielectric layer 56 may be formed on the entire surface through chemical vapor deposition (CVD) or atomic layer deposition (ALD). The gate dielectric layer 56 may include a silicon oxide, a high-k substance, or the like.

Next, preliminary first gate electrodes 57A and preliminary shield gate electrodes 58A are respectively formed on the first sidewalls and the second sidewalls of the pillars 54 which are formed with the gate dielectric layer 56. The preliminary shield gate electrodes 58A and the preliminary first gate electrodes 57A may extend in the first direction. In order to form the preliminary shield gate electrodes 58A and the preliminary first gate electrodes 57A, an etch-back process may be performed after forming a first conductive layer on the entire surface. According to this fact, the preliminary shield gate electrodes 58A and the preliminary first gate electrodes 57A may be simultaneously formed. The first conductive layer may include an oxide, a metal nitride with low reactivity or a low resistance metal. For example, the preliminary shield gate electrodes 58A may include TiN, TiAlN, WN, TaN, W, Al, Ru, Pt, Au, or the like. Hereafter, in the present embodiment, the first conductive layer may be formed using a titanium nitride (TiN).

Figure 11D:
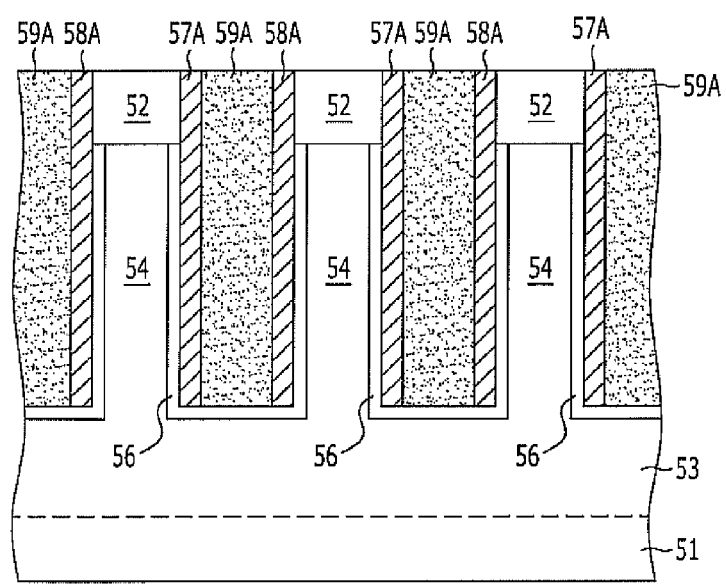

Referring to FIG. 11D, a first dielectric layer 59A is formed to fill the spaces between the pillars 54 which are formed with the preliminary first gate electrodes 57A and the preliminary shield gate electrodes 58A. The first dielectric layer 59A may include an oxide such as a silicon oxide. The first dielectric layer 59A may be planarized through CMP or the like until the surfaces of the hard mask layer patterns 52 are exposed.

Figure 11E:
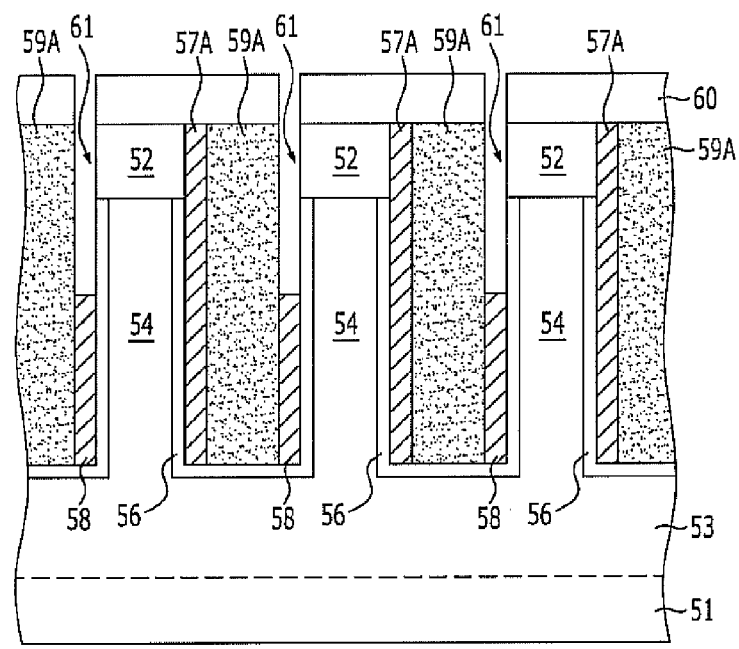

Referring to FIG. 11E, photoresist patterns 60 are formed. The photoresist patterns 60 may have shapes which expose the upper surfaces of the preliminary shield gate electrodes 58A.

The preliminary shield gate electrodes 58A are etched by a predetermined depth using the photoresist patterns 60 as an etch barrier. According to this fact, shield gate electrodes 58 are formed, and gaps 61 are defined on the shield gate electrodes 58.

Figure 11F:
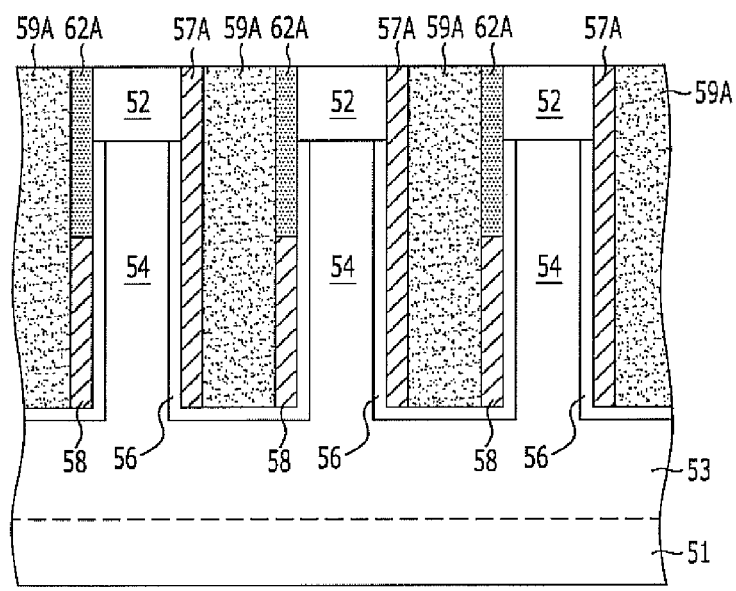

Referring to FIG. 11F, a second dielectric layer 62A is formed to fill the gaps 61. The second dielectric layer 62A may include an oxide such as a silicon oxide. Also, the second dielectric layer 62A may include a nitride such as a silicon nitride. The second dielectric layer 62A may be planarized through CMP or the like until the surfaces of the hard mask layer patterns 52 are exposed. The second dielectric layer 62A is formed on the shield gate electrodes 58.

Figure 11G:
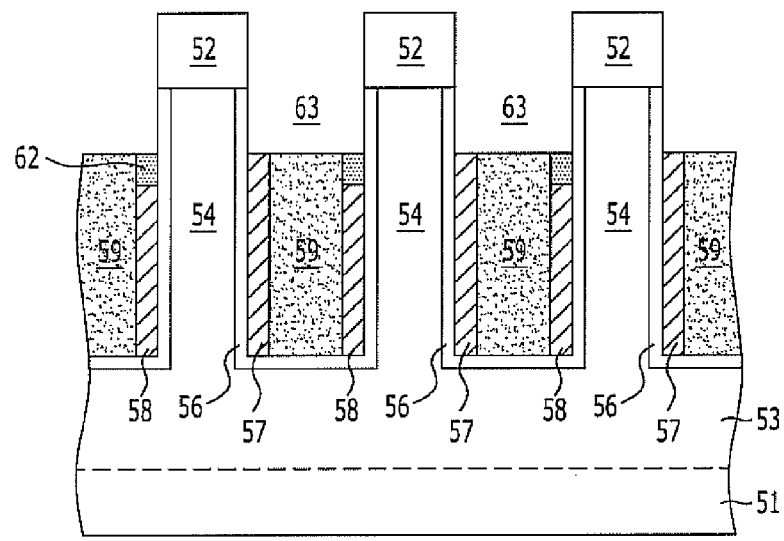

Referring to FIG. 11G, the preliminary first gate electrodes 57A, the first dielectric layer 59A and the second dielectric layer 62A are recessed by a predefined depth. According to this fact, first recesses 63 are defined. The depth of the first recesses 63 may be lower than the upper surfaces of the pillars 54. First gate electrodes 57 are formed by the first recesses 63, and the upper surfaces of the first gate electrodes 57 are exposed. First and second dielectric layers 59 and 62 remain on the bottoms of the first recesses 63. The first recesses 63 are defined such that the shield gate electrodes 58 are not exposed. In other words, the second dielectric layer 62 remains by a predetermined thickness on the shield gate electrodes 58.

By forming the first gate electrodes 57 as described above, double gate structures including the shield gate electrodes 58 and the first gate electrodes 57 are formed in a self-aligned manner on the first sidewalls and the second sidewalls of the pillars 54. The shield gate electrodes 58 and the first gate electrodes 57 have a height difference. The shield gate electrodes 58 have a height lower than the first gate electrodes 57. While the first gate electrodes 57 serve as the gate electrodes of vertical channel transistors, the shield gate electrodes 58 do not serve as gate electrodes. The shield gate electrodes 58 may perform a function of shielding electric fields by the neighbor first gate electrodes 57, by which it is possible to minimize a neighbor gate effect.

Figure 11H:
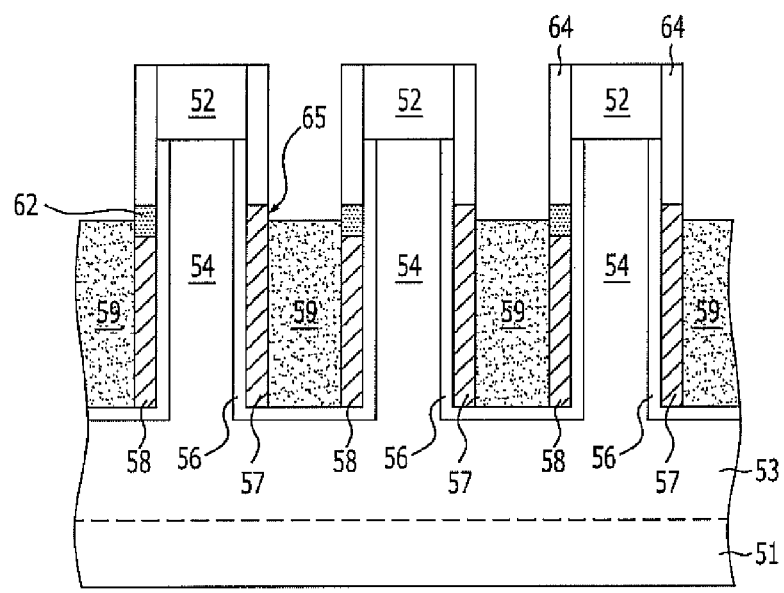

Referring to FIG. 11H, spacers 64 are formed on both sidewalls of the first recesses 63. The spacers 64 may be formed using an oxide such as a silicon oxide. For example, the spacers 64 are formed by depositing a silicon oxide on the entire surface and then performing etch-back. The thickness of the spacers 64 may be the same as the thickness of the underlying first gate electrodes 57.

The first dielectric layer 59 is partially etched back to be self-aligned with the spacers 64. By this fact, the upper portions of the sidewalls of the first gate electrodes 57 are exposed. When etching back the first dielectric layer 59, a depth is controlled such that the shield gate electrodes 58 are not exposed. Namely, the second dielectric layer 62 remains on the shield gate electrodes 58.

By etching back the first dielectric layer 59 using the spacers 64 in this way, the upper portions of the sidewalls of the first gate electrodes 57 are exposed as indicated by the reference numeral 65.

Figure 11I:
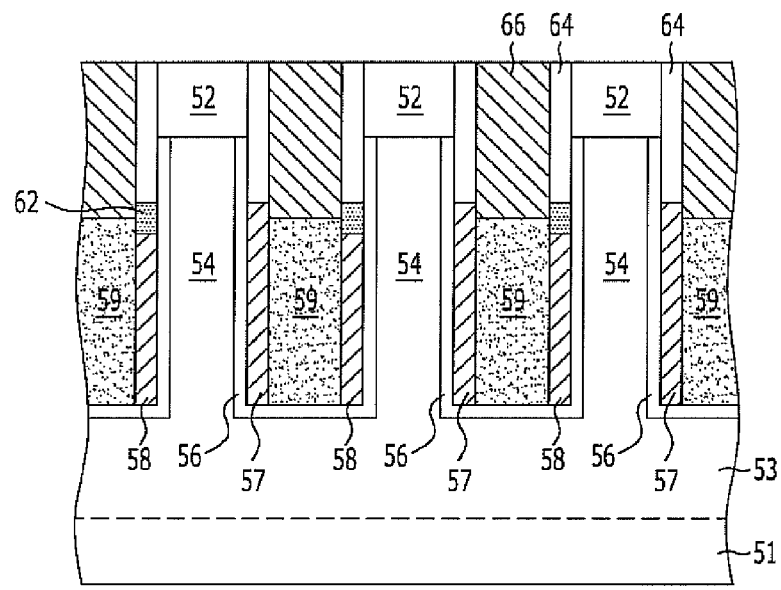

Referring to FIG. 11I, second gate electrodes 66 are formed to fill the spaces defined on the first dielectric layer 59. The second gate electrodes 66 may extend in the first direction. In order to form the second gate electrodes 66, an etch-back process may be performed after forming a second conductive layer on the entire surface. The second conductive layer may include W, Al, Ru, Pt, Au, or the like. Hereafter, the second conductive layer may be formed of tungsten (W). The second gate electrodes 66 may have buried structures.

The second gate electrodes 66 are connected with the first gate electrodes 57, and may be isolated from the shield gate electrodes 58 by the first and second dielectric layers 59 and 62.

As can be readily seen from the above descriptions, the vertical channel transistors in accordance with the third embodiment of the present invention has a double gate structure in which the first gate electrodes 57 and the shield gate electrodes 58 are formed on both sidewalls of the pillars 54.

Figure 11J:
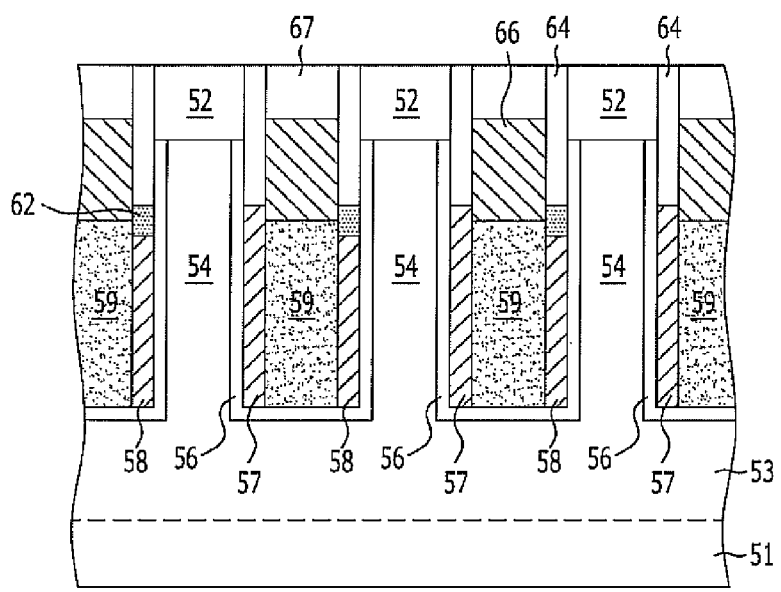

Referring to FIG. 11J, the surfaces of the second gate electrodes 66 are recessed.

A capping layer 67 is formed to fill the spaces which are defined on the recessed second gate electrodes 66. The capping layer 67 may include an oxide layer such as a silicon oxide. By forming the capping layer 67 in this way, the first and second gate electrodes 57 and 58 are isolated from surrounding structures.

Figure 12A:
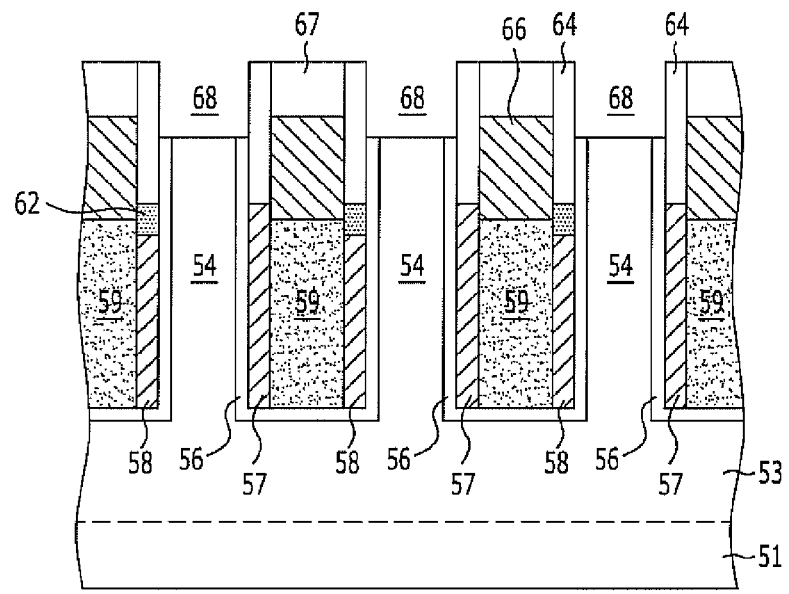
FIGS. 12A to 12C are views explaining a method for fabricating a capacitor of the semiconductor device to which the vertical channel transistors in accordance with the third embodiment of the present invention are applied.
Figure 12B:
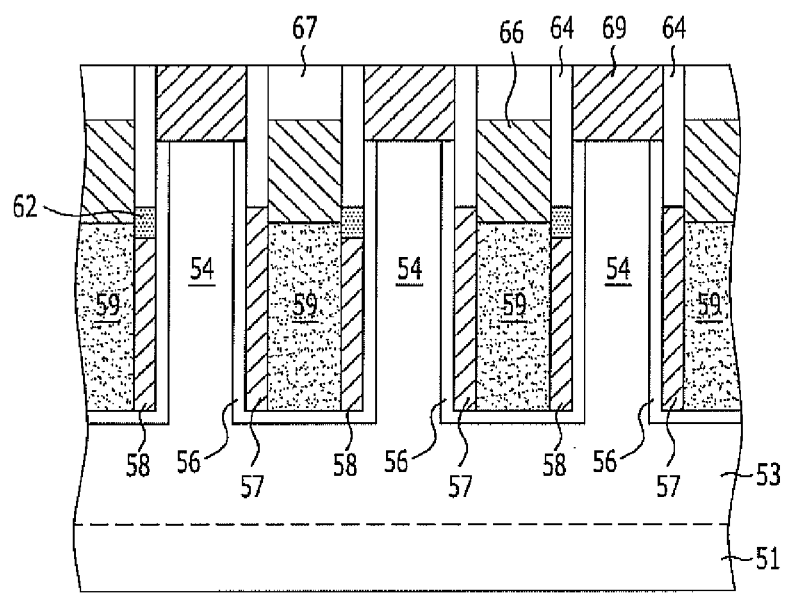
Figure 12C:
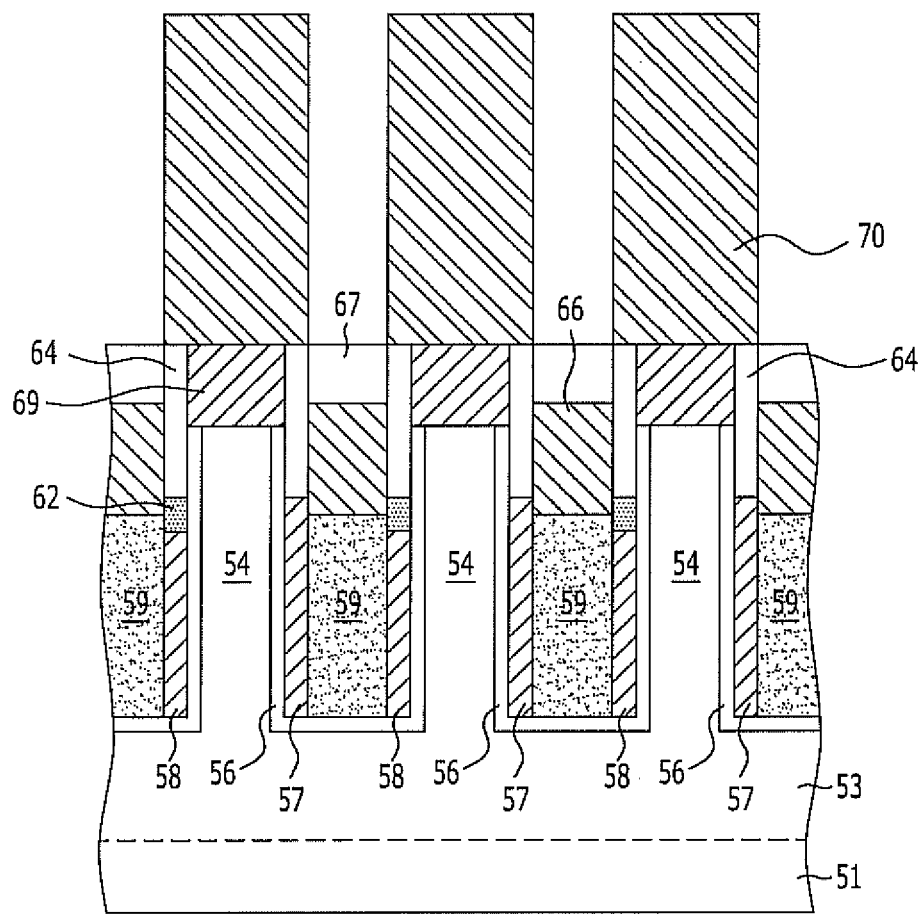

FIGS. 12A to 12C are views explaining a method for fabricating a capacitor of the semiconductor device to which the vertical channel transistors in accordance with the third embodiment of the present invention are applied.

Referring to FIG. 12A, contact holes 68 are defined by removing the hard mask layer patterns 52. Since the spacers 64 and the capping layer 67 are a silicon oxide and the hard mask layer patterns 52 are a silicon nitride, the hard mask layer patterns 52 may be removed through a wet etching using a phosphoric acid. According to this fact, the contact holes 68 are defined in a self-defined manner by the capping layer 67 and the spacers 64. The upper surfaces of the pillars 54 are exposed on the bottoms of the contact holes 68.

Referring to FIG. 12B, contact plugs 69 are formed to be buried in the contact holes 68. The contact plugs 69 may include a polysilicon, a metal or the like. For example, after depositing a polysilicon to fill the contact holes 68, a planarization process may be performed. The spacers 64 surround the sidewalls of the contact plugs 69. While not shown, ion implantation for forming sources/drains may be carried out before forming the contact plugs 69.

Referring to FIG. 12C, storage nodes 70 of capacitors are formed on the contact plugs 69. The storage nodes 70 may have pillar shapes. In another embodiment, the storage nodes 70 may have cylinder shapes. As a method for forming the storage nodes 70, well-known methods may be adopted. For example, after forming a mold layer (not shown), open parts are formed by etching the mold layer, and the storage nodes 70 are formed in the open parts. Then, the mold layer is removed through a full dip-out process.

While not shown, supporters for supporting the outer walls of the storage nodes 70 may be additionally formed. For example, a substance for supporters is formed on the mold layer, and supporters may be formed by partially etching the substance for supporters before performing the full dip-out process. Furthermore, a dielectric layer and plate nodes may be additionally formed on the storage nodes 70.

Figure 13:
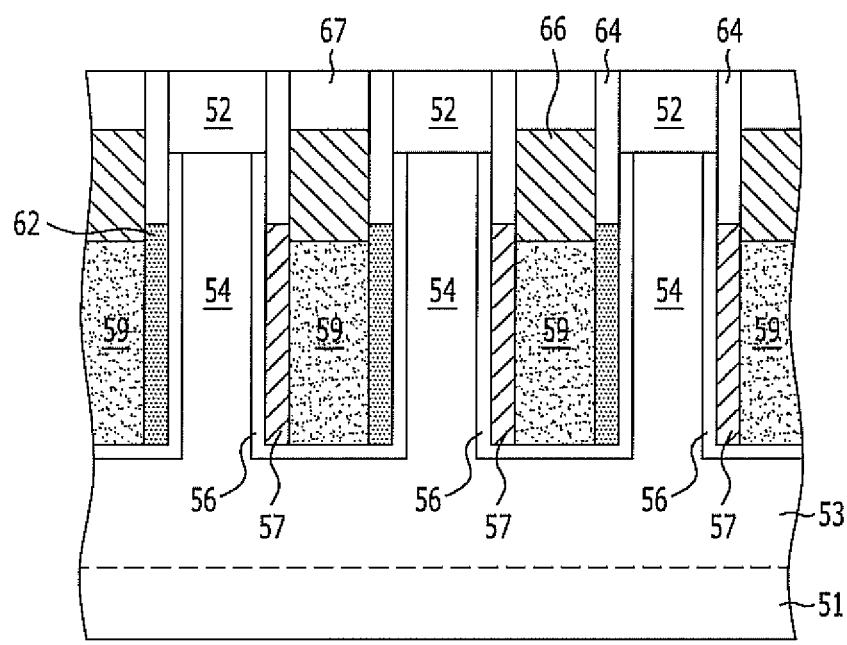
FIG. 13 is a view illustrating vertical channel transistors in accordance with a fourth embodiment of the present invention.

FIG. 13 is a view illustrating vertical channel transistors in accordance with a fourth embodiment of the present invention.

Referring to FIG. 13, vertical channel transistors in accordance with a fourth embodiment of the present invention may include pillars 54, first gate electrodes 57, and second gate electrodes 66.

First, a plurality of pillars 54 are formed on a semiconductor substrate 51 to vertically project from the surface of the semiconductor substrate 51. Bodies 53 may be further formed under the pillars 54. The pillars 54 may vertically project from the surfaces of the bodies 53. The plurality of pillars 54 may have a matrix arrangement. The pillars 54 may be quadrangular pillars each of which has a plurality of sidewalls. The pillars 54 may be arranged to be isolated by an interlayer dielectric layer (not shown) in a first direction Y, and the first and second sidewalls of the pillars 54 laterally opposing each other may be exposed in a second direction X. Each pillar 54 may have a source region, a drain region and a channel region (not numbered). The drain region may be formed in top portion of the pillar 54, and the source region may be formed in bottom portion of the pillar 54. The channel region may be formed between the drain region and the source region. The semiconductor substrate 51, the bodies 53 and the pillars 54 include a silicon-containing substance. For example, a silicon substrate or a silicon-germanium substrate may be used.

Accordingly, the pillar 54 may include a semiconductor pillar, a silicon pillar or a silicon-germanium pillar.

A gate dielectric layer 56 is formed on the first sidewalls and the second sidewalls of the pillars 54. The gate dielectric layer 56 may include a silicon oxide or a high-k substance.

The first gate electrodes 57 are formed on the gate dielectric layer 56 to cover the first sidewalls of the pillars 54. The first gate electrodes 57 may be formed to be lower than the height of the pillars 54. The first gate electrodes 57 may become vertical gate electrodes.

The second gate electrodes 66 which are connected to the upper portions of the sidewalls of the first gate electrodes 57 are formed between the plurality of pillars 54. The second gate electrodes 66 may serve as word lines. The second gate electrodes 66 may have shapes which are buried in the upper portions of the spaces defined between the plurality of pillars 54. For example, the second gate electrodes 66 may be buried between the hard mask layer patterns 52. A first dielectric layer 59 may be formed between the first gate electrodes 57 and adjoining pillars 54. The first gate electrodes 57 and a second dielectric layer 62 may have the same height. The first dielectric layer 59 may have a height lower than the first gate electrodes 57 and the second dielectric layer 62. The second dielectric layer 62 may be formed on the facing-away sidewalls of the pillars 54. The first dielectric layer 59 may be recessed by a predetermined depth, and the second gate electrodes 66 may be formed on the first dielectric layer 59 which is recessed. Spacers 64 may be formed on the second dielectric layer 62 and the first gate electrodes 57. The second gate electrodes 66 may be isolated from the surrounding structures by the spacers 64. A capping layer 67 may be additionally formed on the second gate electrodes 66.

The first gate electrodes 57 have line-shaped vertical gate structures which extend in the first direction Y. The second gate electrodes 66 have shapes which extend in the first direction Y in the same manner as the first gate electrodes 57. The first gate electrodes 57 may include a metal nitride or a low resistance metal. For example, the first gate electrodes 57 may include TiN, TiAlN, WN, TaN, W, Al, Ru, Pt, Au, or the like. The second gate electrodes 66 may include W, Al, Ru, Pt, Au, or the like.

According to FIG. 13, the vertical channel transistors in accordance with the fourth embodiment of the present invention have single gate structures in which the first gate electrodes 57 are formed on only one sidewalls of the pillars 54. The first gate electrodes 57 become the gate electrodes of vertical channel transistors. Furthermore, as only the first gate electrodes 57 are formed on the sidewalls of the pillars 54, the first gate electrodes 57 may be formed to have a substantial thickness. According to this fact, gate resistance may be reduced. In particular, because only the first gate electrodes 57 are formed without forming shield gate electrodes, a neighbor gate effect may be originally prevented.

Figure 14:
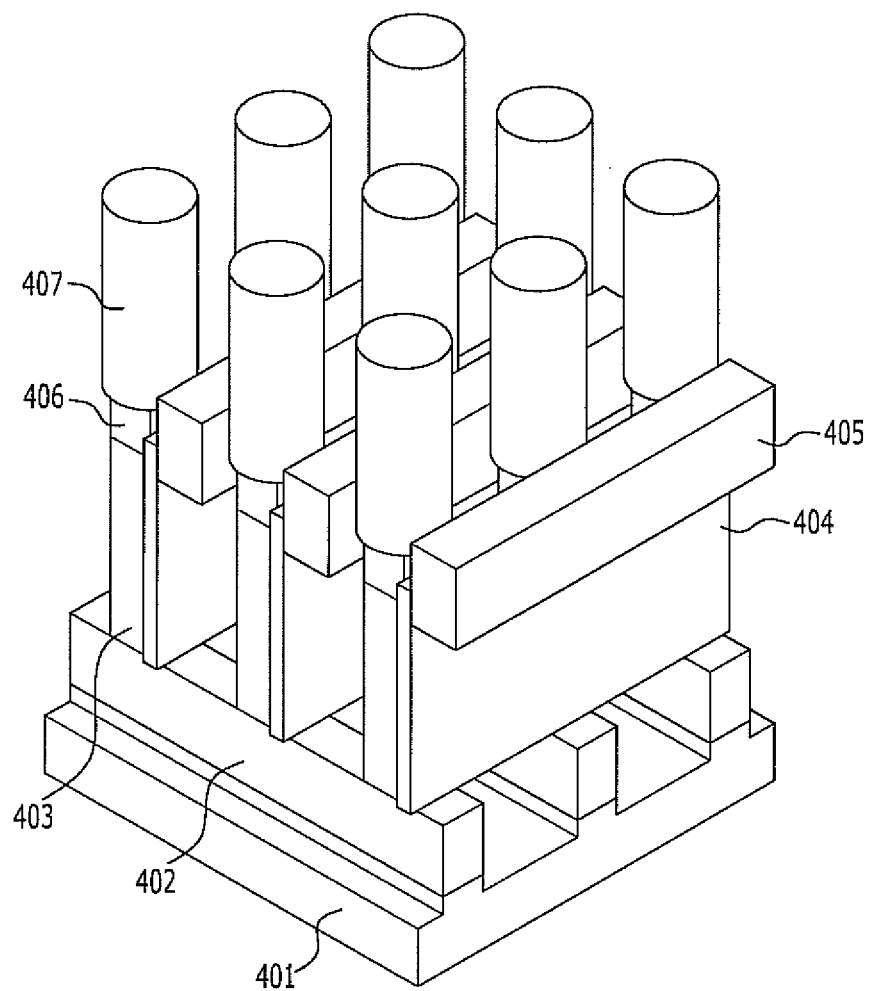
FIG. 14 is a perspective view illustrating a semiconductor device to which the vertical channel transistors in accordance with the fourth embodiment of the present invention are applied.

FIG. 14 is a perspective view illustrating a semiconductor device to which the vertical channel transistors in accordance with the fourth embodiment of the present invention are applied.

Referring to FIG. 14, vertical channel transistors include first gate electrodes 404, second gate electrodes 405, and pillars 403. As buried bit lines 402 and capacitors 407 are connected to the vertical channel transistors, a semiconductor device such as a DRAM may be realized. The buried bit lines 402 may be electrically connected with the bottom portions of the pillars 403. The buried bit lines 402 may be vertically formed on a semiconductor substrate 401 and may extend in a first direction. The first gate electrodes 404 and the second gate electrodes 405 may extend in a second direction perpendicularly crossing with the first direction. The capacitors 407 may be electrically connected with the top portions of the pillars 403. Contact plugs 406 may be additionally formed between the capacitors 407 and the pillars 403. While not shown, the capacitors 407 may include storage nodes, a dielectric layer and plate nodes. The vertical channel transistors may be applied not only to a memory such as a DRAM but also to a nonvolatile memory such as a flash memory.

FIGS. 15A to 15F are views explaining an exemplary method for fabricating the vertical channel transistors in accordance with the fourth embodiment of the present invention. Unlike the third embodiment, when defining gaps, shield gate electrodes are entirely removed. Hereinbelow, reference will be made to FIGS. 11A to 11D for processes before defining the gaps.

Figure 15A:
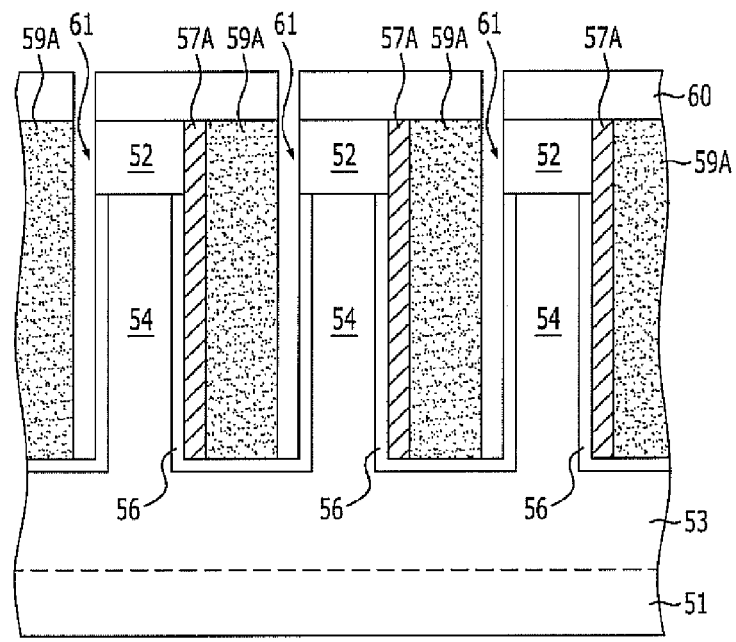
FIGS. 15A to 15F are views explaining an exemplary method for fabricating the vertical channel transistors in accordance with the fourth embodiment of the present invention.

Referring to FIG. 15A, photoresist patterns 60 are formed. The photoresist patterns 60 may have shapes which expose the upper surfaces of the preliminary shield gate electrodes 58A.

The preliminary shield gate electrodes 58A are entirely etched using the photoresist patterns 60 as an etch barrier. According to this fact, gaps 61 are defined. The preliminary shield gate electrodes 58A removed in this way may become sacrificial gate electrodes.

By entirely removing the preliminary shield gate electrodes 58A, only preliminary first gate electrodes 57A remain on the one sidewalls of the pillars 54.

Figure 15B:
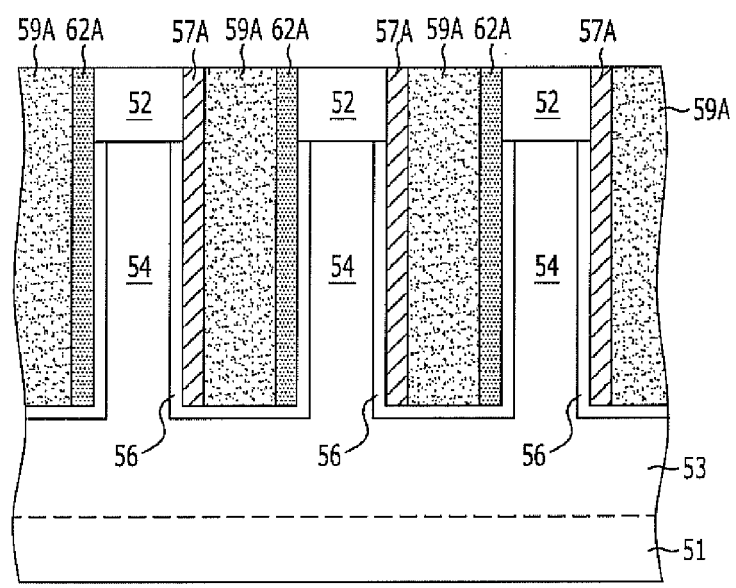

Referring to FIG. 15B, a second dielectric layer 62A is formed to fill the gaps 61. The second dielectric layer 62A may include an oxide such as a silicon oxide. Also, the second dielectric layer 62A may include a nitride such as a silicon nitride. The second dielectric layer 62A may be planarized through CMP or the like until the surfaces of the hard mask layer patterns 52 are exposed.

Figure 15C:
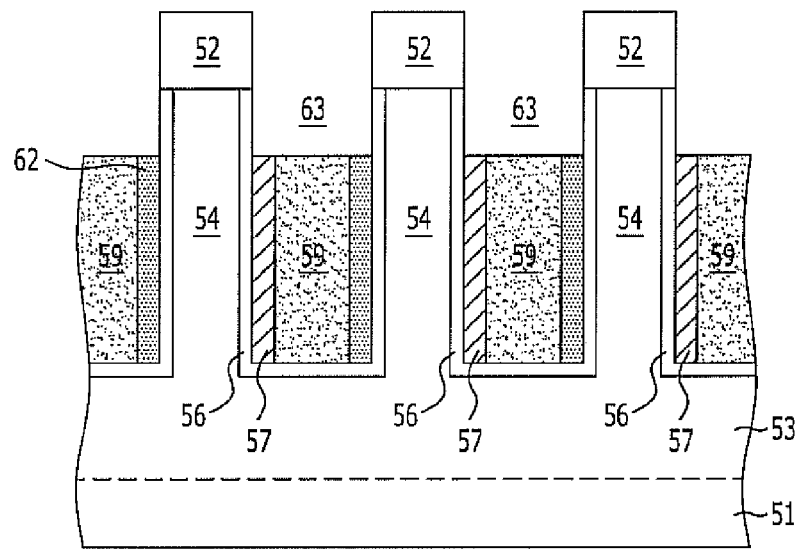

Referring to FIG. 15C, the preliminary first gate electrodes 57A, the first dielectric layer 59A and the second dielectric layer 62A are recessed by a predefined depth. According to this fact, first recesses 63 are defined. The depth of the first recesses 63 may be lower than the surfaces of the pillars 54. First gate electrodes 57 are formed by the first recesses 63, and the upper surfaces of the first gate electrodes 57 are exposed. The first and second dielectric layers 59 and 62 remain on the bottoms of the first recesses 63.

The first gate electrodes 57 serve as the gate electrodes of the vertical channel transistors. By not forming shield gate electrodes, a neighbor gate effect by neighbor gates may be originally prevented.

Figure 15D:
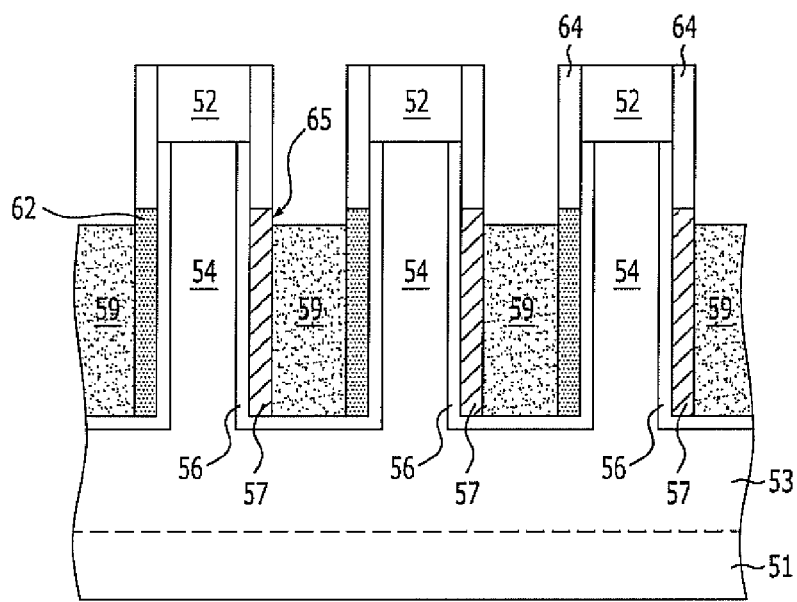

Referring to FIG. 15D, spacers 64 are formed on both sidewalls of the first recesses 63. The spacers 64 may be formed of an oxide such as a silicon oxide. For example, the spacers 64 may be formed by depositing a silicon oxide on the entire surface and etching back the silicon oxide. The thickness of the spacers 64 may be the same as the thickness of the underlying first gate electrodes 57.

The first dielectric layer 59 is partially etched back to be self-aligned with the spacers 64. Due to this fact, the upper portions of the sidewalls of the first gate electrodes 57 are exposed.

By etching back the first dielectric layer 59 using the spacers 64 in this way, the upper portions of the sidewalls of the first gate electrodes 57 are exposed as indicated by the reference numeral 65.

Figure 15E:
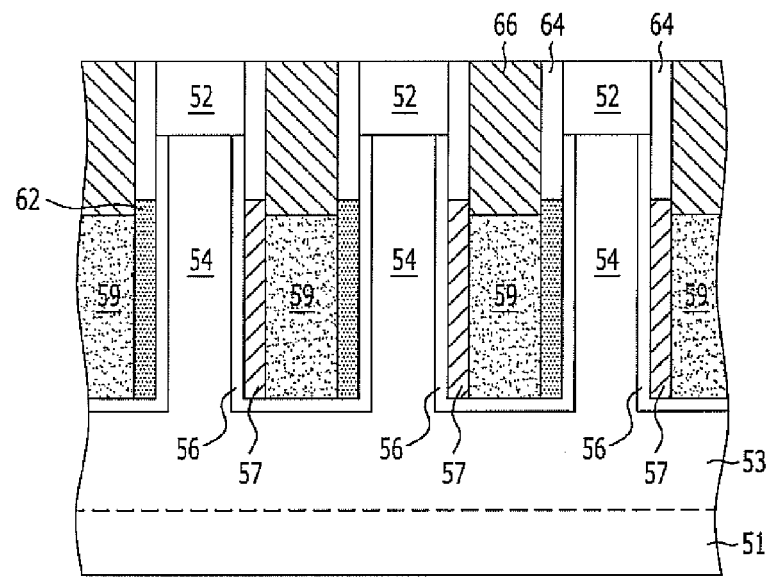

Referring to FIG. 15E, second gate electrodes 66 are formed to fill the spaces defined on the first dielectric layer 59. The second gate electrodes 66 may extend in the first direction. In order to form the second gate electrodes 66, an etch-back process may be performed after forming a second conductive layer on the entire surface. The second conductive layer may include W, Al, Ru, Pt, Au, or the like. The second conductive layer may be formed of tungsten (W). The second gate electrodes 66 may have buried structures.

The second gate electrodes 66 are connected with the upper portions of the sidewalls of the first gate electrodes 57.

As can be readily seen from the above descriptions, the vertical channel transistors in accordance with the fourth embodiment of the present invention have single gate structures in which the first gate electrodes 57 are formed on only any one sidewalls of the pillars 54.

Figure 15F:
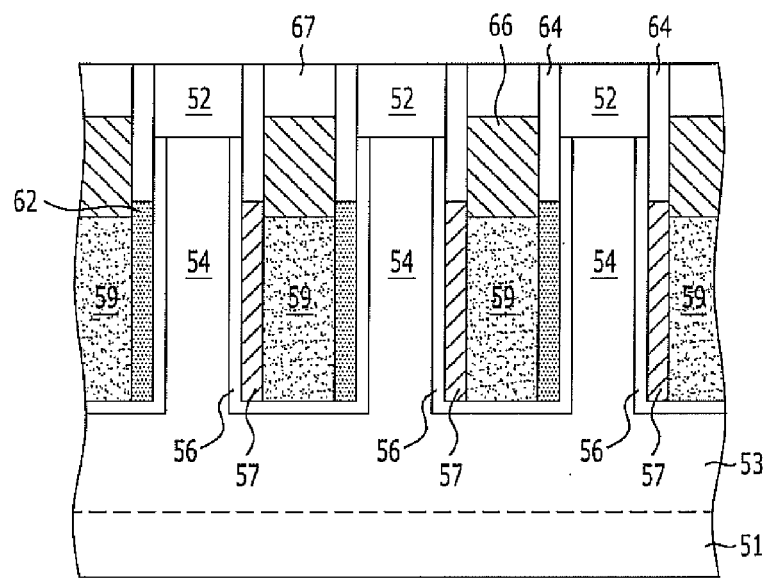

Referring to FIG. 15F, the surfaces of the second gate electrodes 66 are recessed.

A capping layer 67 is formed to fill the spaces defined on the second gate electrodes 66 which are recessed. The capping layer 67 may include an oxide such as a silicon oxide.

Contact plugs and capacitors are subsequently formed. Reference may be made to FIGS. 12A to 12C for a method for forming the contact plugs and the capacitors.

A method for forming the buried bit lines in accordance with the first to fourth embodiments of the present invention will be described below. Hereinbelow, explanations will be made for a method for forming the buried bit lines of the semiconductor device to which the vertical channel transistors in accordance with the first embodiment shown in FIG. 2 is applied. The same method may be applied to the other embodiments. The buried bit lines may be formed before forming the first dielectric layer in FIG. 3B. That is to say, after forming the bodies shown in FIG. 3A, the buried bit lines may be formed before forming the first dielectric layer in FIG. 3B.

FIGS. 16A to 16K are views explaining a method for forming a buried bit line of the semiconductor device to which the vertical channel transistors in accordance with the embodiments of the present invention are applied.

Figure 16A:
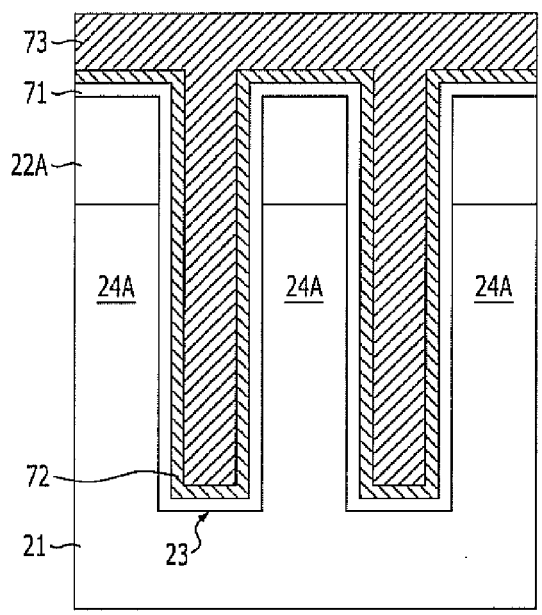
FIGS. 16A to 16K are views explaining a method for forming a buried bit line of the semiconductor device to which the vertical channel transistors in accordance with the embodiments of the present invention are applied.

Referring to FIG. 16A, passivation layers are formed on the entire surface including bodies (see the reference numeral 24A of FIG. 4A). As the passivation layers, a first passivation layer 71 and a second passivation layer 72 may be stacked. Each of the first passivation layer 71 and the second passivation layer 72 may include an oxide, a nitride, or the like. Because the first passivation layer 71 and the second passivation layer 72 should have etching selectivities, different substances are selected as the first passivation layer 71 and the second passivation layer 72. For example, if an oxide is used to form the first passivation layer 71, a substance with an etching selectivity with respect to the oxide is selected to form the second passivation layer 72. If the first passivation layer 71 is formed of an oxide, the second passivation layer 72 may be formed of a nitride.

A first sacrificial layer 73 is formed on the entire surface of a resultant structure including the second passivation layer 72 in such a way as to gapfill first trenches 23 between the bodies 24A. A substance having a different etching selectivity with respect to the first and second passivation layers 71 and 72 may be used to form the first sacrificial layer 73. The first sacrificial layer 73 may include an oxide layer, a nitride layer, a silicon layer, or the like. Here, while a substance used as the first and second passivation layers 71 and 72 may be repeatedly used as the first sacrificial layer 73, a different substance is used to have a different etching selectivity. Hereinbelow, as the first sacrificial layer 73, a silicon layer may be used.

Figure 16B:
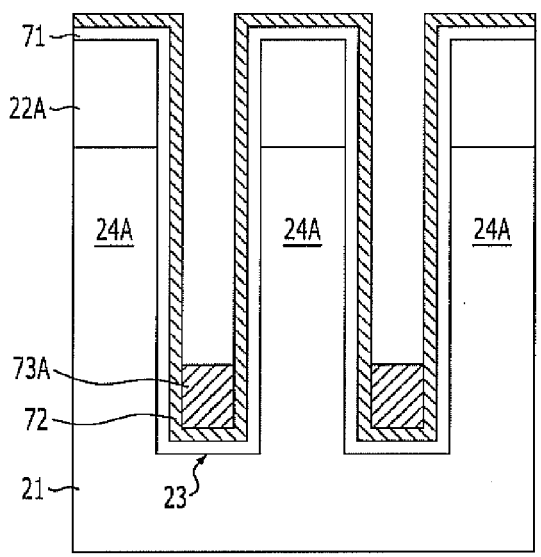

Referring to FIG. 16B, the first sacrificial layer 73 is planarized. The planarization of the first sacrificial layer 73 includes a CMP (chemical mechanical polishing) process. Successively, an etch-back process is performed. By the etch-back process, first sacrificial layer patterns 73A which are recessed are formed. During the etch-back process, the second passivation layer 72 is not etched since it has an etching selectivity different from that of the first sacrificial layer 73.

Figure 16C:
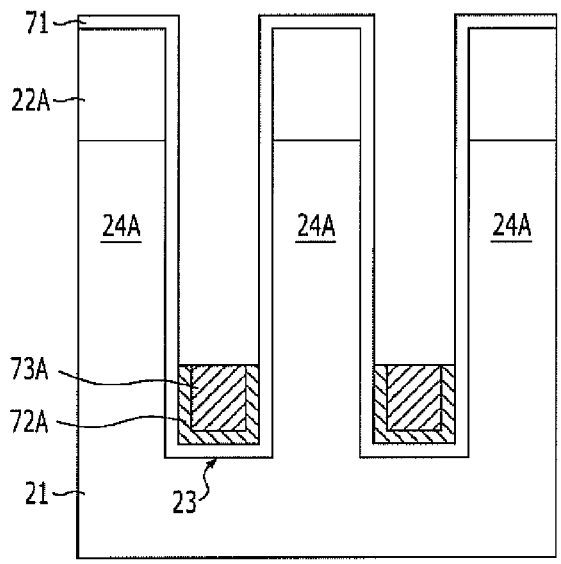

Referring to FIG. 16C, portions of the second passivation layer 72 which are exposed by the recessed first sacrificial layer patterns 73A are selectively removed. By this fact, second passivation layer patterns 72A with the same height as the first sacrificial layer patterns 73A are formed. In order to remove the second passivation layer 72, wet etching or dry etching may be adopted.

Figure 16D:
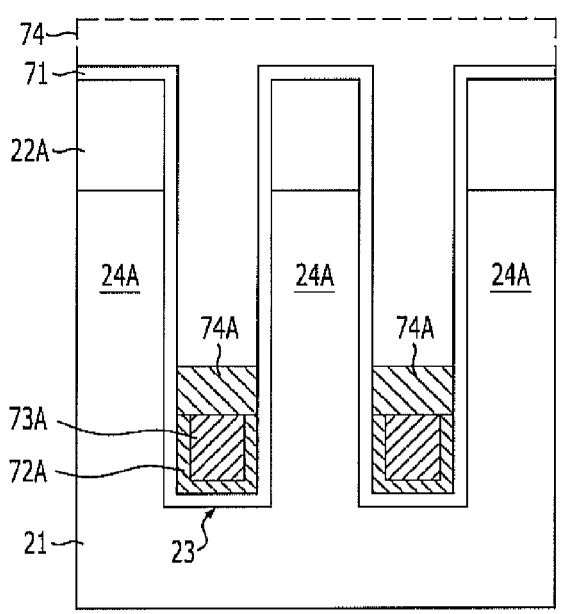

Referring to FIG. 16D, a second sacrificial layer 74 is formed on the entire surface of the resultant structure formed with the second passivation layer patterns 72A. The second sacrificial layer 74 gapfills the first trenches 23. The second sacrificial layer 74 may be formed of a substance with a different etching selectivity from the first passivation layer 71. The second sacrificial layer 74 may include an oxide layer, a nitride layer, a silicon layer, or the like. Here, while a substance used as the first passivation layer 71 may be repeatedly used as the second sacrificial layer 74, a different substance is used to have a different etching selectivity. Hereinbelow, according to the present embodiment, as the second sacrificial layer 74, a silicon layer may be used.

The second sacrificial layer 74 is planarized. The planarization of the second sacrificial layer 74 includes a CMP (chemical mechanical polishing) process. Successively, an etch-back process is performed. By the etch-back process, second sacrificial layer patterns 74A which are recessed are formed. During the etch-back process, the first passivation layer 71 is not etched since it has an etching selectivity different from that of the second sacrificial layer 74.

Figure 16E:
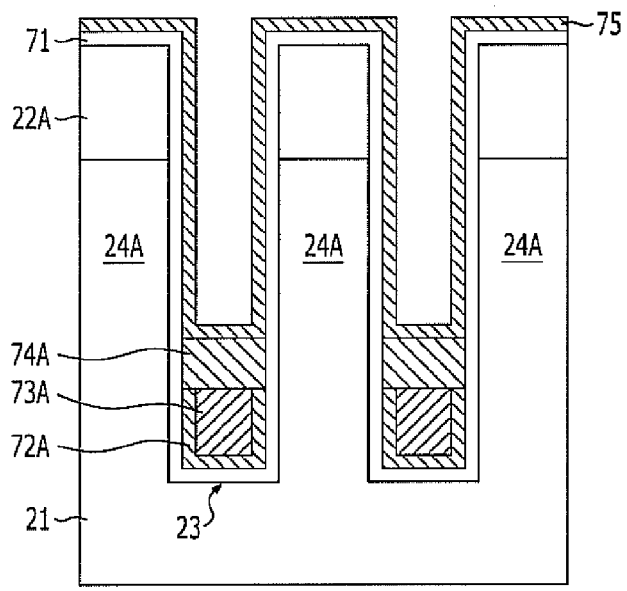

Referring to FIG. 16E, a third passivation layer 75 is formed on the entire surface of the resultant structure including the second sacrificial layer patterns 74A. The third passivation layer 75 may include an oxide layer, a nitride layer, a silicon layer, or the like. The third passivation layer 75 may be formed of a substance with a different etching selectivity from the first passivation layer 71. Therefore, different substances are selected as the first passivation layer 71 and the third passivation layer 75. For example, if an oxide layer is used as the first passivation layer 71, a substance with a different etching selectivity from the oxide layer is selected as the third passivation layer 75. If the oxide layer is used as the first passivation layer 71, a nitride layer may be used as the third passivation layer 75.

Figure 16F:
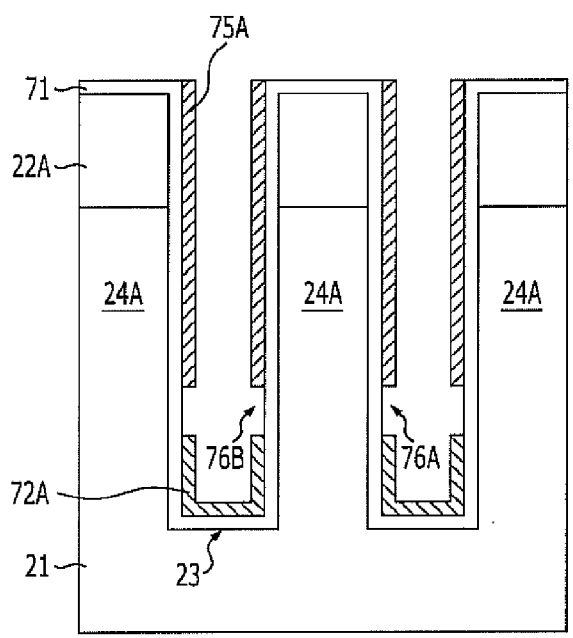

Referring to FIG. 16F, the third passivation layer 75 is selectively etched through spacer etching. According to this fact, third passivation layer patterns 75A are formed. The third passivation layer patterns 75A have the forms of spacers which cover the sidewalls of the bodies 24A and the hard mask layer patterns 22A. The third passivation layer patterns 75A have a height that covers the sidewalls of the bodies 24A and the hard mask layer patterns 22A on the second sacrificial layer patterns 74A. The third passivation layer patterns 75A cover the first passivation layer 71. By the third passivation layer patterns 75A, the underlying second sacrificial layer patterns 74A are exposed.

The second sacrificial layer patterns 74A are removed. The second sacrificial layer patterns 74A are removed using dry etching or wet etching.

As the second sacrificial layer patterns 74A are removed in this way, preliminary open parts 76A and 76B are formed between the third passivation layer patterns 75A and the second passivation layer patterns 72A. The preliminary open parts 76A and 76B expose portions of the first passivation layer 71. The preliminary open parts 76A and 76B are open with the forms of lines which extend along the sidewalls of the bodies 24A. In particular, the preliminary open parts 76A and 76B are open on both sidewalls of the bodies 24A.

Figure 16G:
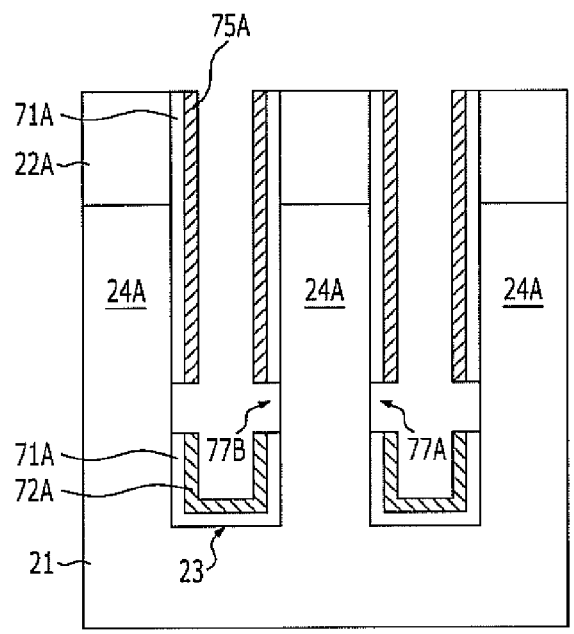

Referring to FIG. 16G, the portions of the first passivation layer 71 which are exposed through the preliminary open parts 76A and 76B are selectively removed. By this fact, open parts 77A and 77B are formed. The sidewalls of the bodies 24A, which are formed with the open parts 77A and 77B, are covered by first passivation layer patterns 71A, the second passivation layer patterns 72A and the third passivation layer patterns 75A. When viewed from the positions of the open parts 77A and 77B, the lower sidewalls of the bodies 24A are covered by the first passivation layer patterns 71A and the second passivation layer patterns 72A, and the upper sidewalls of the bodies 24A are covered by the first passivation layer patterns 71A and the third passivation layer patterns 75A. When forming the open parts 77A and 77B, portions of the first passivation layer 71 which are formed on the hard mask layer patterns 22A may be simultaneously removed.

The open parts 77A and 77B may be open with the forms of lines which extend along the sidewalls of the bodies 24A. Specifically, the open parts 77A and 77B are simultaneously formed on both sidewalls of the bodies 24A. Thus, a series of processes for forming the open parts 77A and 77B are referred to as a double-side-contact (DSC) process. The double-side-contact (DSC) process is contrasted with an OSC (one-side-contact) process. While the OSC process is a process for opening only any one of both sidewalls of each body, the double-side-contact (DSC) process is a process for opening both sidewalls of each body 24A.

The double-side-contact (DSC) process as described above is simple unlike the OSC process. Also, tilt ion implantation and an OSC mask may not be used. In particular, the height of the open parts 77A and 77B may be uniformized.

Figure 16H:
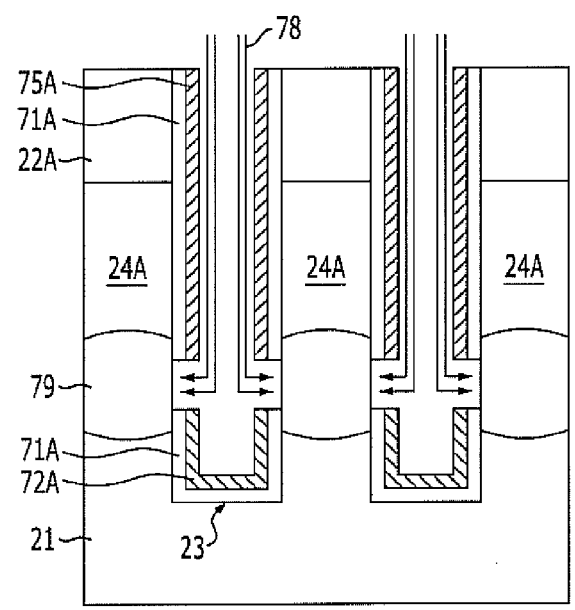

Referring to FIG. 16H, plasma doping 78 is performed. At this time, portions of the sidewalls of the bodies 24A which are exposed through the open parts 77A and 77B are doped. Accordingly, source/drain regions 79 are formed. The source/drain regions 79 become source regions or drain regions of vertical channel transistors.

The source/drain regions 79 may be formed by performing tilt ion implantation instead of the plasma doping 78. As another method for forming the source/drain regions 79, doped polysilicon in situ doped with a dopant may be used. For example, by performing annealing after gapfilling the doped polysilicon, the dopant in the doped polysilicon may be diffused into the bodies 24A.

Figure 16I:
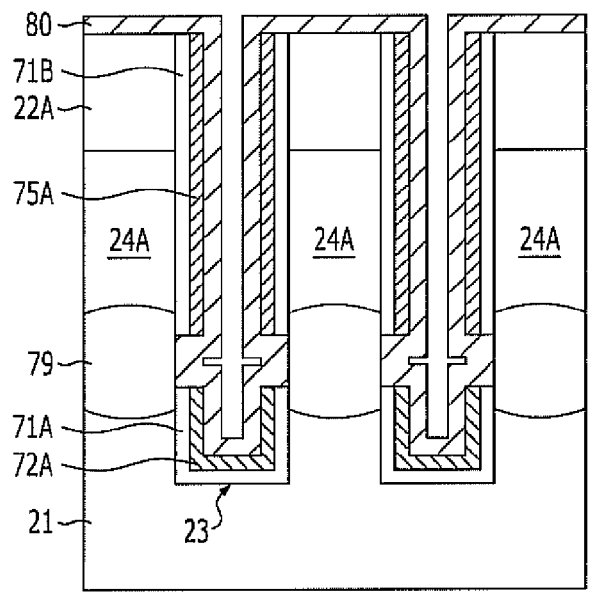

Referring to FIG. 16I, a conductive layer 80 is formed on the entire surface of the resultant structure including the open parts 77A and 77B. The conductive layer 80 includes a metal such as a near-noble metal and a refractory metal. The conductive layer 80 includes a metal capable of silicidation. For example, the conductive layer 80 includes any one selected among cobalt (Co), titanium (Ti), tantalum (Ta), nickel (Ni), tungsten (W), platinum (Pt) and palladium (Pd). The conductive layer 80 is formed using chemical vapor deposition (CVD) or atomic layer deposition (ALD). The deposition thickness of the conductive layer 80 is determined to a thickness capable of filling at least the open parts 77A and 77B. Such a thickness is selected to permit full silicidation in a subsequent silicidation process.

Figure 16J:
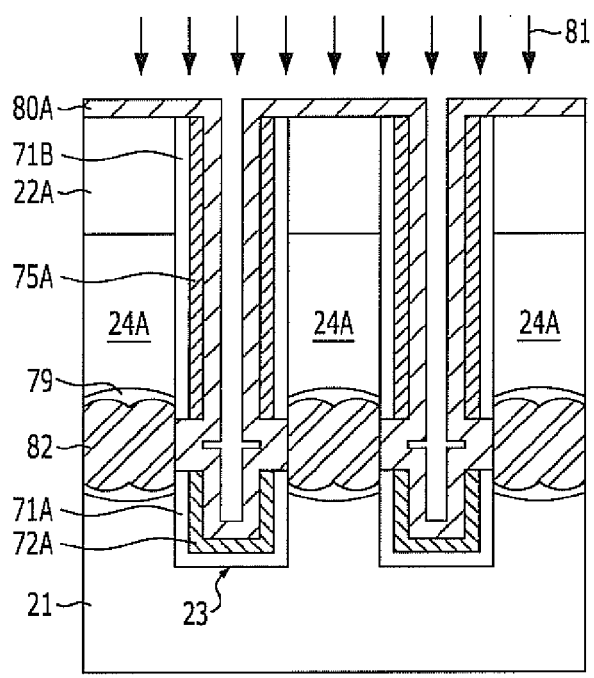

Referring to FIG. 16J, annealing 81 is performed. According to this fact, silicidation is effected in which the conductive layer 80 and the bodies 24A react with each other. Since the conductive layer 80 is a metal and the material of the bodies 24A contains silicon, a metal silicide 82 is formed by the reaction of the conductive layer 80 and the bodies 24A. The metal silicide 82 includes any one selected among a cobalt silicide, a titanium silicide, a tantalum silicide, a nickel silicide, a tungsten silicide, a platinum silicide and a palladium silicide. The annealing 81 includes rapid thermal annealing (RTA). The rapid thermal annealing (RTA) may be performed at different temperatures depending upon the kinds of the bodies 24A and the conductive layer 80. For example, in the case where the conductive layer 80 is formed using cobalt (Co), an annealing temperature range may be approximately 400° C. to approximately 800° C. The metal silicide 82 may be formed to have a fully silicidated (FUSI) structure. By sufficiently performing silicidation from both sidewalls of the bodies 24A, the portions of the bodies 24A which are exposed through the open parts 77A and 77B are fully silicidated. Through full silicidation, the metal silicide 82 is formed in the bodies 24A.

After forming the metal silicide 82, an unreacted conductive layer 80A remains. The metal silicide 82, which is formed through the silicidation process as described above, becomes buried bit lines (BBL). Hereinbelow, the metal silicide is referred to as buried bit lines 82.

Figure 16K:
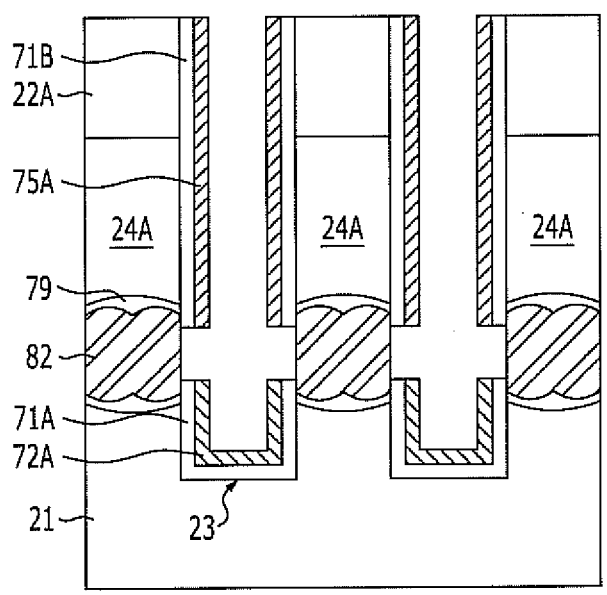

Referring to FIG. 16K, the unreacted conductive layer 80A is removed. The unreacted conductive layer 80A may be removed through wet etching.

Meanwhile, in the case where the conductive layer 80 is formed using cobalt, in order to form a cobalt silicide, rapid thermal annealing (RTA) is performed at least twice. For example, primary annealing and secondary annealing are performed. The primary annealing is performed at a temperature of approximately 400° C. to approximately 600° C., and the secondary annealing is performed at a temperature of approximately 600° C. to approximately 800° C. By the primary annealing, a cobalt silicide with the phase of $CoSi_x$ (x=approximately 0.1 to approximately 1.5) is formed. By the secondary annealing, a cobalt silicide with the phase of $CoSi_2$ is obtained. Among cobalt silicides, the cobalt silicide with the phase of $CoSi_2$ has smallest specific resistance. Unreacted cobalt is removed between the primary annealing and the secondary annealing. The unreacted cobalt may be removed using a mixed chemical of sulphuric acid ($H_2SO_4$) and hydrogen peroxide ($H_2O_2$).

The vertical channel transistors in accordance with the embodiments of the present invention may be included in an electronic apparatus. The electronic apparatus may be a PDA, a laptop computer, a notebook computer, a web tablet, a wireless phone, a mobile phone, a digital music player, a wired or wireless electronic appliance, or one of composite electronic apparatuses including at least two of them. The electronic apparatus may include memories, and the memories may include the vertical channel transistors in accordance with the embodiments of the present invention.

The semiconductor devices in accordance with the embodiments of the present invention may be used to realize a memory system. The memory system may include memories for storing a large amount of data and a memory controller. The memory controller controls the memories to read or write data from or to the memories in response to a read/write request from a host. The memory controller may constitute an address mapping table for mapping the addresses provided from the host, for example, a mobile terminal or a computer system, into physical addresses. The memories may include the vertical channel transistors in accordance with the embodiments of the present invention.

As is apparent from the above descriptions, according to the embodiments of the present invention, it is possible to form self-aligned vertical gate electrodes with a single gate structure or a double gate structure.

In the embodiments of the present invention, as the single gate structure is formed through forming only one vertical gate electrode on the sidewall of a pillar, the vertical gate electrode may be formed thick. According to this fact, gate resistance may be reduced. Also, as the single gate structure is formed through forming one vertical gate electrode without a shield gate electrode, a neighbor gate effect may be minimized.

Furthermore, in the embodiments of the present invention, even when a double gate structure is formed through respectively forming a shield gate electrode and a vertical gate electrode on both sidewalls of a pillar, the vertical gate electrode may be formed thick by decreasing the height of the shield gate electrode. Accordingly, gate resistance may be reduced. Moreover, a neighbor gate effect may be minimized due to the presence of the shield gate electrode.

While the present invention has been described with respect to the specific embodiments, it will be apparent to those skilled in the art that various changes and modifications may be made without departing from the spirit and scope of the invention as defined in the following claims.

What is claimed is:

1. A method for fabricating vertical channel transistors, comprising:
   forming a plurality of pillars which have laterally opposing both sidewalls, over a substrate;
   forming a gate dielectric layer on both sidewalls of the pillars;
   forming first gate electrodes which cover any one sidewalls of the pillars and shield gate electrodes which cover the other sidewalls of the pillars and have a height lower than the first gate electrodes, over the gate dielectric layer; and
   forming second gate electrodes which are connected with upper portions of sidewalls of the first gate electrodes.

2. The method according to claim 1, wherein the forming of the first gate electrodes and the shield gate electrodes comprises:
   forming the first gate electrodes and preliminary shield gate electrodes which respectively cover both sidewalls of the pillars;
   filling a gap between each of the plurality of pillars with a first dielectric layer;
   forming the shield gate electrodes by partially removing the preliminary shield gate electrodes by a predetermined depth; and
   filling a gap formed over each of the shield gate electrodes with a second dielectric layer over.

3. The method according to claim 2, wherein the forming of the shield gate electrodes comprises:
   forming photoresist patterns which expose upper surfaces of the preliminary shield gate electrodes and cover the first gate electrodes and the pillars; and
   forming gaps formed over the shield gate electrodes by etching upper portions of the preliminary shield gate electrodes.

4. The method according to claim 2, wherein the forming of the second gate electrodes comprises:
   forming recesses by partially removing the first dielectric layer and the second dielectric layer; and
   filling the recesses with a conductive layer to form the second gate electrodes.

5. The method according to claim 1, further comprising:
   recessing upper portions of the first gate electrodes and the second gate electrodes after the forming of the second gate electrodes; and
   forming a capping layer to fill the recessed upper portions.

6. The method according to claim 1, wherein the forming of the first gate electrodes and the shield gate electrodes comprises:
   forming preliminary first gate electrodes and preliminary shield gate electrodes which respectively cover both sidewalls of the pillars;
   filling a gap between each of the plurality of pillars with a first dielectric layer;
   forming the shield gate electrodes by partially removing the preliminary shield gate electrodes by a predetermined depth;
   filling a gap formed over each of the shield gate electrodes with a second dielectric layer; and
   recessing the preliminary first gate electrodes, the first dielectric layer and the second dielectric layer by a predetermined depth to form the first gate electrodes and first recesses over the first gate electrodes.

7. The method according to claim 6, wherein the forming of the shield gate electrodes comprises:
   forming photoresist patterns which expose upper surfaces of the preliminary shield gate electrodes and cover the first gate electrodes and the pillars; and
   forming gaps formed over the shield gate electrodes by etching upper portions of the preliminary shield gate electrodes.

8. The method according to claim 6, wherein the forming of the second gate electrodes comprises:
   forming spacers on both sidewalls of the first recesses;
   forming second recesses by recessing the first dielectric layer to be self-aligned with the spacers; and
   filling a conductive layer in the second recesses to form the second gate electrodes.

9. The method according to claim 1, wherein the first gate electrodes have a line-shaped vertical gate structure which extends in a first direction, and the second gate electrodes have a shape which extends in the same direction as the first gate electrodes.

10. The method according to claim 1, wherein the first gate electrodes comprise a titanium nitride layer, and the second gate electrodes comprise a tungsten layer.

11. A method for fabricating vertical channel transistors, comprising:
    forming a plurality of pillars which have laterally opposing both sidewalls, over a substrate;
    forming a gate dielectric layer on both sidewalls of the pillars;
    forming first gate electrodes which cover any one sidewalls of both sidewalls of the pillars; and
    forming second gate electrodes which are connected with upper portions of sidewalls of the first gate electrodes.

12. The method according to claim 11, wherein the forming of the first gate electrodes comprises:
    forming sacrificial gate electrodes and the first gate electrodes which respectively cover both sidewalls of the pillars;
    filling a gap between each of the plurality of pillars with a first dielectric layer;
    forming gaps by removing the sacrificial gate electrodes; and
    forming a second dielectric layer to fill the gaps.

13. The method according to claim 12, wherein the forming of the gaps comprises:
    forming photoresist patterns which expose upper surfaces of the sacrificial gate electrodes and cover the first gate electrodes and the pillars; and
    etching the sacrificial gate electrodes.

14. The method according to claim 12, wherein the forming of the second gate electrodes comprises:
   forming recesses by partially removing the first dielectric layer and the second dielectric layer; and
   filling the recesses with a conductive layer to form the second gate electrodes.

15. The method according to claim 11, further comprising:
   recessing portions of the second gate electrodes after the forming of the second gate electrodes; and
   forming a capping layer to fill the recessed portions.

16. The method according to claim 11, wherein the forming of the first gate electrodes comprises:
   forming preliminary first gate electrodes and sacrificial gate electrodes which respectively cover both sidewalls of the pillars;
   filling a gap between each of the plurality of pillars with a first dielectric layer;
   forming gaps by removing the sacrificial gate electrodes;
   forming a second dielectric layer to fill the gaps; and
   recessing the preliminary first gate electrodes, the first dielectric layer and the second dielectric layer by a predetermined depth to form the first gate electrodes and first recesses over the first gate electrodes.

17. The method according to claim 16, wherein the forming of the gaps comprises:
   forming photoresist patterns which expose upper surfaces of the sacrificial gate electrodes and cover the first gate electrodes and the pillars; and
   etching the sacrificial gate electrodes.

18. The method according to claim 16, wherein the forming of the second gate electrodes comprises:
   forming spacers on both sidewalls of the first recesses;
   forming second recesses by recessing the first dielectric layer to be self-aligned with the spacers; and
   filling the second recesses with a conductive layer to form the second gate electrodes.

19. The method according to claim 11, further comprising:
   recessing portions of the second gate electrodes after the forming of the second gate electrodes; and
   forming a capping layer to fill the recessed portions.

20. The method according to claim 11, wherein the first gate electrodes have a line-shaped vertical gate structure which extends in a first direction, and the second gate electrodes have a shape which extends in the same direction as the first gate electrodes.

21. The method according to claim 11, wherein the first gate electrodes comprises a titanium nitride layer, and the second gate electrodes comprises a tungsten layer.

22. A method for fabricating a semiconductor device, comprising:
   forming hard mask layer patterns over a semiconductor substrate;
   forming bodies by etching the semiconductor substrate using the hard mask layer patterns as an etch barrier;
   forming buried bit lines in the bodies;
   etching the hard mask layer patterns and upper portions of the bodies to form pillars which have laterally opposing both sidewalls;
   forming first gate electrodes on any one sidewalls of both sidewalls of the pillars;
   forming second gate electrodes which are connected with upper portions of sidewalls of the first gate electrodes; and
   forming storage nodes which are connected with the pillars.

23. The method according to claim 22, further comprising:
   forming shield gate electrodes which have a height lower than the first gate electrodes, on the other sidewalls of the pillars.

24. The method according to claim 22, further comprising:
   recessing upper portions of the first gate electrodes and the second gate electrodes by a predetermined depth after the forming of the second gate electrodes; and
   filling the recessed upper portions with a capping layer.

25. The method according to claim 22, wherein the forming of the first gate electrodes comprises:
   forming preliminary first gate electrodes and sacrificial gate electrodes which respectively cover both sidewalls of the pillars;
   filling a gap between each of the plurality of pillars with a first dielectric layer;
   forming gaps by removing the sacrificial gate electrodes;
   forming a second dielectric layer to fill the gaps; and
   recessing the preliminary first gate electrodes, the first dielectric layer and the second dielectric layer by a predetermined depth to form the first gate electrodes and first recesses over the first gate electrodes.

26. The method according to claim 25, wherein the forming of the second gate electrodes comprises:
   forming spacers on both sidewalls of the first recesses;
   forming second recesses by recessing the first dielectric layer to be self-aligned with the spacers; and
   filling the second recesses with a conductive layer to form the second gate electrodes.

27. The method according to claim 26, further comprising:
   forming contact holes by removing the hard mask layer patterns before the forming of the storage nodes; and
   filling storage node contact plugs in the contact holes.

28. The method according to claim 22, further comprising:
   forming contact holes by removing the hard mask layer patterns before the forming of the storage nodes;
   forming spacers on sidewalls of the contact holes; and
   filling storage node contact plugs in the contact holes.

* * * * *